US012768028B2

(12) United States Patent
Han

(10) Patent No.: US 12,768,028 B2
(45) Date of Patent: Oct. 20, 2026

(54) MASK ASSEMBLY AND METHOD FOR MANUFACTURING THE SAME

(71) Applicant: Samsung Display Co., Ltd., Yongin-si (KR)

(72) Inventor: Jeongwon Han, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 592 days.

(21) Appl. No.: 18/469,701

(22) Filed: Sep. 19, 2023

(65) Prior Publication Data

US 2024/0158906 A1 May 16, 2024

(30) Foreign Application Priority Data

Nov. 10, 2022 (KR) ........................ 10-2022-0149826

(51) Int. Cl.

*C23C 14/04* (2006.01)
*C23C 16/458* (2006.01)
*H10K 71/16* (2023.01)

(52) U.S. Cl.

CPC ............ *C23C 14/042* (2013.01); *C23C 14/04* (2013.01); *C23C 16/4585* (2013.01); *H10K 71/166* (2023.02)

(58) Field of Classification Search

CPC ... C23C 14/042; C23C 14/04; C23C 16/4585; H10K 71/166; H10K 71/00

See application file for complete search history.

(56) References Cited

U.S. PATENT DOCUMENTS

| | | | | |
|---|---|---|---|---|
| 9,142,779 | B2 | 9/2015 | Chan et al. | |
| 10,161,030 | B2 | 12/2018 | Han | |
| 2016/0139511 | A1* | 5/2016 | Li | H01J 37/32009 216/48 |
| 2024/0158906 | A1* | 5/2024 | Han | C23C 14/04 |
| 2025/0189883 | A1* | 6/2025 | Jang | G03F 1/64 |

FOREIGN PATENT DOCUMENTS

| | | | | | |
|---|---|---|---|---|---|
| CN | 119553222 | A | * | 3/2025 | C23C 14/042 |
| KR | 1659961 | B1 | * | 9/2016 | |
| KR | 10-2114950 | | | 5/2020 | |
| KR | 2024170716 | A | * | 12/2024 | |
| KR | 20240170716 | A | * | 12/2024 | C23C 14/042 |
| KR | 2025037658 | A | * | 3/2025 | |

(Continued)

OTHER PUBLICATIONS

"INVAR Alloys", Total Materia , Dec. 15, 2015 (Total 4 pages) [online] https://www.totalmateria.com/page.aspx?ID=CheckArticle&site=ktn&NM=374.

(Continued)

*Primary Examiner* — Jeffrie R Lund

(74) *Attorney, Agent, or Firm* — CANTOR COLBURN LLP

(57) ABSTRACT

The disclosure relates to a mask assembly and a method of manufacturing a mask assembly. The mask assembly includes a frame including a frame opening and grooves, each arranged in a first direction and a second direction intersecting the first direction, and a mask including support lines each inserted into a corresponding one of the grooves. Each of the support lines includes a carbon nanotube fiber.

20 Claims, 16 Drawing Sheets

(56) References Cited

FOREIGN PATENT DOCUMENTS

KR 20250140659 A * 9/2025 ........... H10H 20/018

OTHER PUBLICATIONS

"Carbon Nanotube", Wikipedia (Total 34 pages) [online] https://en.wikipedia.org/wiki/Carbon_nanotube.

"CNTs Fibers", Time Nano (Total 2 pages) [online] http://timesnano.com/en/view.php?prt=3,35,158,159.

Huisheng PENG et al., "Polymer Composites with Carbon Nanotubes in Alignment", INTECH, Carbon Nanotubes—Polymer Nanocomposites, SBN: 978-953-307-498-6, Aug. 17, 2011, pp. 231-250 (Total 22 pages).

"Micro OLED FMM", Fine Mask, APS Inc. (Total 1 page) [online] https://apsholdings.co.kr/eng/business/fmm.asp.

Gengzhi Sun et al., "Fabrication of Microscale Carbon Nanotube Fibers", Hindawi Publishing Corporation, Journal of Nanomaterials, vol. 2012, Article ID: 506209, DOI: 10.1155/2012/506209, pp. 1-10 (Total 11 pages).

* cited by examiner

MASK ASSEMBLY AND METHOD FOR MANUFACTURING THE SAME

CROSS REFERENCE TO RELATED APPLICATION(S)

This application claims priority to and the benefits of Korean Patent Application No. 10-2022-0149826 under 35 U.S.C. § 119, filed on Nov. 10, 2022, in the Korean Intellectual Property Office (KIPO), the entire contents of which are incorporated herein by reference.

BACKGROUND

1. Technical Field

Embodiments of the disclosure relate a mask assembly used in a deposition process and a method for manufacturing the same.

2. Description of the Related Art

Display devices such as televisions, mobile phones, tablet computers, navigation devices, game consoles, or the like include display panels for displaying images. The display panels may include pixels including driving elements such as transistors or the like and display elements such as organic light emitting diodes or the like. The pixels may be formed by depositing a conductive pattern, a light emitting pattern, and various functional layers on a substrate using a mask assembly.

The mask assembly may include a mask having openings defining a deposition area. However, since an area of the mask on which the openings are formed is thin, the mask may be damaged by impact during a deposition process or a cleaning process.

SUMMARY

Embodiments of the disclosure provide a method of manufacturing a mask assembly including a mask having improved durability and a mask assembly including the mask.

According to an embodiment, a mask assembly may include a frame including a frame opening and grooves, each arranged in a first direction and a second direction intersecting the first direction, and a mask including support lines each inserted into a corresponding one of the grooves. Each of the support lines may include a carbon nanotube fiber.

The frame may further include a first side wall, a second side wall, a third side wall, and a fourth side wall connected to each other and defining the frame opening, and protrusions arranged on the first, second, third, and fourth side walls and spaced apart from each other. The first side wall and the second side wall may extend in the second direction and face each other in the first direction with the frame opening interposed between the first side wall and the second side wall, and the third side wall and the fourth side wall may extend in the first direction and face each other in the second direction with the frame opening interposed between the third side wall and the fourth side wall. Each of the grooves may correspond to a space between adjacent ones of the protrusions.

The protrusions may have a quadrangular shape, a trapezoidal shape, or an inverted trapezoidal shape in a cross-sectional view.

A thickness of each of the protrusions in a thickness direction of the frame may be less than or equal to a diameter of each of the support lines.

Each of the support lines may include a first end and a second end, the first end may be disposed on an outer surface of one of the first, second, third, and fourth side walls, and the second end may be disposed on an outer surface of another one of the first second, third, fourth side walls.

Each of the support lines may be bent to a thickness direction of the frame and coupled to an outer surface of the frame, and the support lines may include at least two support lines tilted in different directions and coupled to the outer surface of the frame.

A width of each of the grooves in the first direction or the second direction may be greater than or equal to a diameter of each of the support lines.

The width of each of the grooves may be constant along a thickness direction of the frame.

The width of each of the grooves may change along a thickness direction of the frame.

The support lines may include first support lines extending in a direction, and second support lines extending in another direction. The first support lines and the second support lines may intersect each other in a plan view and define deposition openings overlapping the frame opening in a plan view.

Each of the first support lines may extend in the first direction, the first support lines may be arranged in the second direction, each of the second support lines may extend in the second direction, and the second support lines may be arranged in the first direction.

Each of the first support lines may extend in the first direction, the first support lines may be arranged in the second direction, each of the second support lines may extend in a third direction, the second support lines may be arranged in a direction intersecting the third direction, and the third direction may intersect the first direction and the second direction.

Each of the first support lines may extend in a third direction, the first support lines may be arranged in a direction intersecting the third direction, each of the second support lines may extend in a fourth direction, the second support lines may be arranged in a direction intersecting the fourth direction, and the third direction and the fourth direction may intersect the first direction and the second direction.

According to an embodiment, a method of manufacturing a mask assembly may include providing a frame including a frame opening and grooves, each arranged in a first direction and a second direction intersecting the first direction, coupling a first support line to the frame by inserting the first support line into a corresponding one of the grooves, and coupling a second support line to the frame by inserting the second support line into another corresponding one of the grooves. Each of the first support line and the second support line may include a carbon nanotube fiber, and an extension direction of the second support line may intersect an extension direction of the first support line.

The coupling of the first support line to the frame may include tensioning the first support line in a direction after fixing both ends of the first support line to grippers, inserting the first support line into the corresponding one of the grooves after aligning the first support line on the corresponding one of the grooves, and coupling the first support line to an outer surface of the frame after positioning the both ends of the first support line on the outer surface of the frame.

The coupling of the first support line to the outer surface of the frame may include welding a coupling member after providing the coupling member on a portion of the first support line disposed on the outer surface of the frame.

The direction the first support line is tensioned may be parallel to the first direction.

The direction the first support line is tensioned may intersect the first direction and the second direction.

The coupling of the second support line to the frame may include tensioning the second support line in another direction after fixing both ends of the second support line to the grippers, inserting the second support line into the another corresponding one of the grooves after aligning the second support line on the another corresponding one of the grooves, and coupling the second support line to the outer surface of the frame after positioning the both ends of the second support line on the outer surface of the frame.

The another direction the second support line is tensioned may be parallel to the second direction.

BRIEF DESCRIPTION OF THE DRAWINGS

The above and other objects and features of the disclosure will become apparent by describing in detail embodiments thereof with reference to the accompanying drawings.

DETAILED DESCRIPTION OF THE EMBODIMENTS

Figure 1:
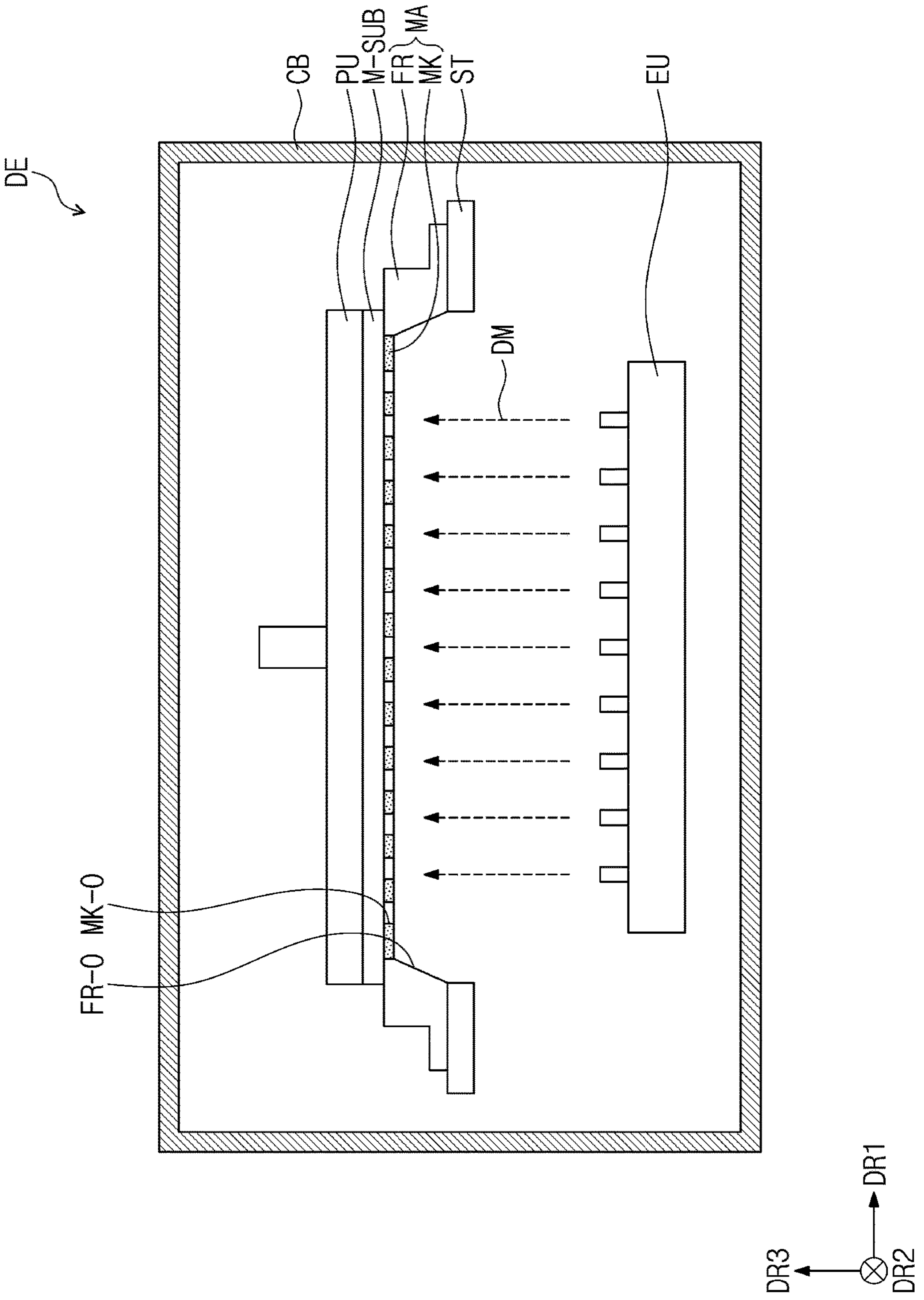
FIG. 1 is a schematic cross-sectional view of a deposition device according to an embodiment of the disclosure.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Since the disclosure can be variously modified and has alternative forms, an embodiment thereof will be illustrated in the drawings and will herein be described in detail. However, it should be understood that the disclosure is not limited to a specific disclosure and includes all changes, equivalents, and substitutes included in the spirit and scope of the disclosure.

Unless otherwise specified, the illustrated embodiments are to be understood as providing example features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

In the specification, the expression that a first component (or an area, a layer, a part, a portion, etc.) is "disposed on", "connected with" or "coupled to" a second component means that the first component is directly disposed on/connected with/coupled to the second component or means that a third component is interposed therebetween. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the first direction DR1, the second direction DR2, and the third direction DR3 are not limited to three axes of a rectangular coordinate system, such as the x, y, and z axes, and may be interpreted in a broader sense. For example, the first direction DR1, the second direction DR2, and the third direction DR3 may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Throughout the specification, when an element is referred to as being "connected" to another element, the element may be "directly connected" to another element, or "electrically connected" to another element with one or more intervening elements interposed therebetween. Also, when an element is referred to as being "in contact" or "contacted" or the like to another element, the element may be in "electrical contact" or in "physical contact" with another element; or in "indirect contact" or in "direct contact" with another element.

The term "and/or" includes all combinations of one or more components that may be defined by associated components. For example, "A and/or B" may be understood to mean "A, B, or A and B." The terms "and" and "or" may be used in the conjunctive or disjunctive sense and may be understood to be equivalent to "and/or."

Although the terms "first", "second", etc. may be used to describe various components, the components should not be limited by the terms. The terms are only used to distinguish one component from another component. For example, without departing from the right scope of the disclosure, a first component may be referred to as a second component, and similarly, the second component may be also referred to as the first component. Singular expressions include plural expressions unless clearly otherwise indicated in the context.

Also, the terms "under", "below", "on", "above", etc. are used to describe the correlation of components illustrated in drawings. The terms that are relative in concept are described based on a direction illustrated in drawings.

It will be understood that the terms "include", "comprise", "have", etc. specify the presence of features, numbers, steps, operations, elements, or components, described in the specification, or a combination thereof, and do not exclude in advance the presence or additional possibility of one or more other features, numbers, steps, operations, elements, or components or a combination thereof. Moreover, the terminology used herein is for the purpose of describing particular embodiments and is not intended to be limiting. As used herein, the singular forms, "a," "an," and "the" are intended to include the plural forms as well, unless the context clearly indicates otherwise. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical terms and scientific terms) used in the present specification have the same meaning as commonly understood by those skilled in the art to which the present disclosure belongs. Furthermore, terms such as terms defined in the dictionaries commonly used should be interpreted as having a meaning consistent with the meaning in the context of the related technology, and should not be interpreted in overly ideal or overly formal meanings unless explicitly defined herein.

Hereinafter, a method of manufacturing a mask assembly and a mask assembly according to an embodiment of the disclosure will be described with reference to the accompanying drawings.

Figure 2:
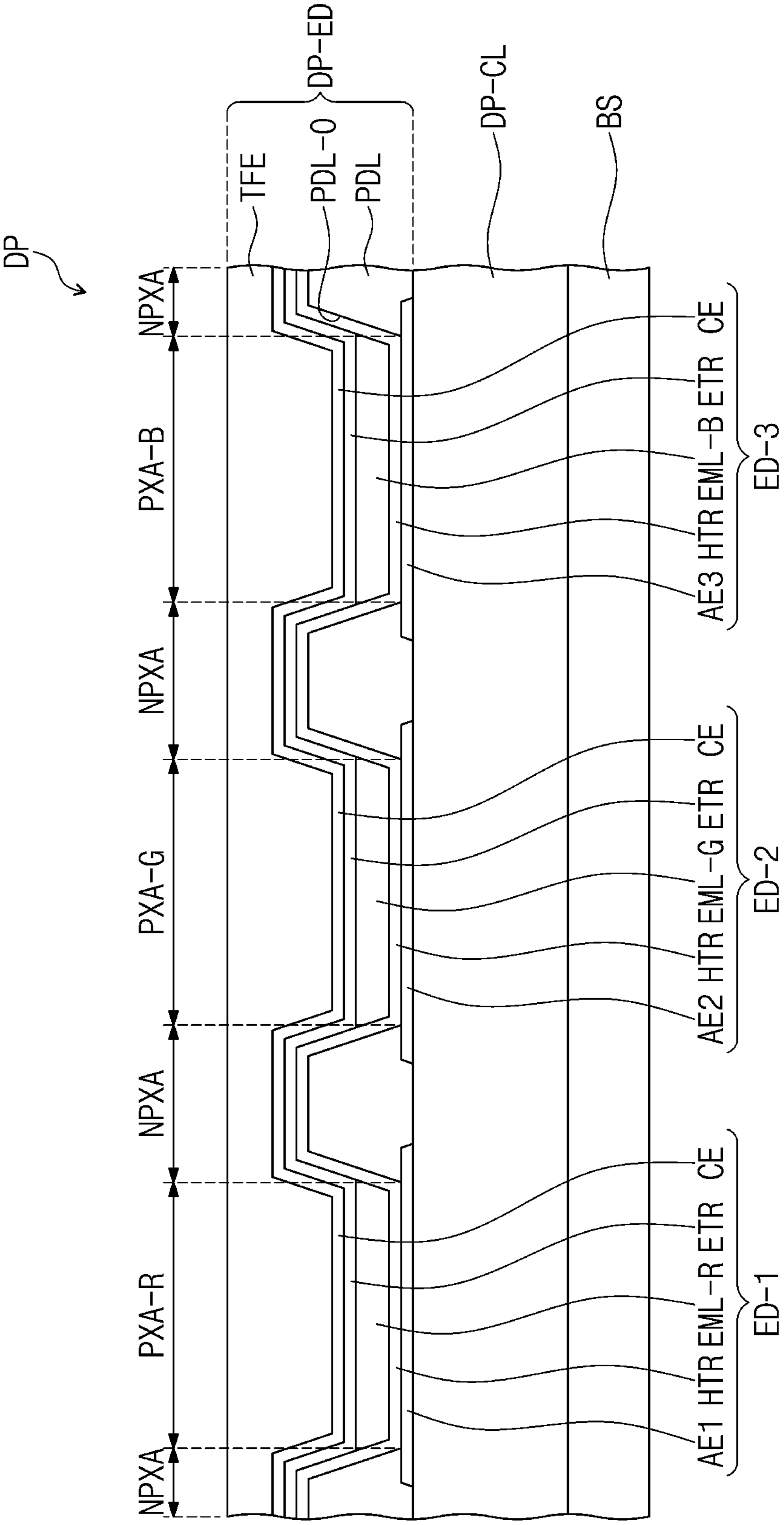
FIG. 2 is a schematic cross-sectional view of a display panel according to an embodiment of the disclosure.

FIG. 1 is a schematic cross-sectional view of a deposition device DE according to an embodiment of the disclosure. FIG. 2 is a schematic cross-sectional view of a display panel DP according to an embodiment of the disclosure.

The deposition device DE according to an embodiment of the disclosure may be used to form at least some of patterns and functional layers included in the display panel DP (see, e.g., FIG. 2), which will be described below. For example, the deposition device DE may be used for a deposition process for manufacturing a display panel DP (see, e.g., FIG. 2) with a high-resolution.

Referring to FIG. 1, the deposition device DE may include a chamber CB, a deposition part EU, a fixing part PU, a stage ST, and a mask assembly MA. The deposition device DE according to an embodiment of the disclosure may further include an additional machine device for implementing an in-line system.

The chamber CB may include a bottom surface, a ceiling surface, and side walls connecting the bottom surface and the ceiling surface providing an inner space. The bottom surface of the chamber CB may be parallel to a surface defined by a first direction DR1 and a second direction DR2, and a normal direction of the bottom surface of the chamber CB may be parallel to a third direction DR3. In the specification, the expression "when viewed in a plan" or "in a plan view" is set on the basis of a surface parallel to the surface defined by the first direction DR1 and the second direction DR2. A normal direction of the display surface, i.e., a thickness direction of the display device DD, may indicate a third direction DR3. In this specification, an expression of "when viewed in a plan" or "in a plan view" may represent a case when viewed in the third direction DR3. Hereinafter, a front surface (or a top surface) and a rear surface (or a bottom surface) of each of layers or units may be distinguished by the third direction DR3. However, directions indicated by the first to third directions DR1, DR2, and DR3 may be a relative concept, and converted with respect to each other, e.g., converted into opposite directions. In the specification, the expression "on a cross section" or "in a cross-sectional view" is defined as a state viewed from the first direction DR1 or the second direction DR2.

The deposition part EU, the fixing part PU, the stage ST, the mask assembly MA, and a manufacturing substrate M-SUB may be arranged inside the chamber CB. In the chamber CB, an enclosed space may be formed, and a deposition condition may be set to a vacuum state. The chamber CB may be provided with at least one gate, and the chamber CB may be opened or closed through the gate. The mask assembly MA and the manufacturing substrate M-SUB may enter or exit the chamber CB through the gate provided in the chamber CB.

The fixing part PU may be disposed on the deposition part EU inside the chamber CB. The fixing part PU may fix the mask assembly MA. For example, the fixing part PU according to an embodiment may include a jig or a robot arm for holding the mask assembly MA. The fixing part PU may include a magnetic material for fixing the mask assembly MA and the manufacturing substrate M-SUB. For example, a magnetic material (or a magnetic body) may generate a magnetic force to apply an attractive force to the mask assembly MA, and accordingly, the manufacturing substrate M-SUB disposed between the mask assembly MA and the fixing part PU may closely contact the mask assembly MA.

The manufacturing substrate M-SUB may be a substrate on which a deposition material DM is deposited. For example, the manufacturing substrate M-SUB may include a support substrate and a synthetic resin layer disposed on the support substrate and corresponding to a base substrate BS (see, e.g., FIG. 2), which will be described below. The support substrate may be removed in a latter part of a process of manufacturing the display panel DP (see, e.g., FIG. 2). According to components formed through the deposition process, the manufacturing substrate M-SUB may include some components of the display panel DP (see, e.g., FIG. 2) disposed on the base substrate BS (see, e.g., FIG. 2).

The deposition part EU may be disposed inside the chamber CB and face the fixing part PU (inside the chamber CB). The deposition part EU may include a space in which the deposition material DM is stored and at least one nozzle for spraying (or supplying) the deposition material DM. The deposition material DM may include an inorganic material, a metal, an organic material, or the like that may be sublimated or vaporized. The deposition material DM may pass through the mask assembly MA and may be deposited on the manufacturing substrate M-SUB in a pattern (a predetermined or selectable pattern).

The mask assembly MA may include a mask MK and a frame FR. The mask MK may be disposed on the frame FR and coupled to (or onto) the frame FR.

The frame FR may support the mask MK. A frame opening FR-O may be defined on the frame FR. The frame FR may have a closed line shape surrounding the frame opening FR-O in a plan view. A shape of the frame FR is not limited to one as long as the frame FR may support the mask MK.

The frame FR may have rigidity (e.g., a predetermined or selectable rigidity). For example, the frame FR may include a metal such as stainless steel (SS), an invar alloy, nickel (Ni), cobalt (Co), or a combination thereof. However, a material of the frame FR is not limited thereto.

The mask MK may include support lines coupled to the frame FR. The mask MK may include multiple deposition openings MK-O defined by the support lines arranged on a plane and intersecting each other. Each of the deposition openings MK-O may be formed by being surrounded by corresponding support lines among the support lines of the mask MK. A detailed description of the mask MK will be made below.

The deposition openings MK-O may overlap the frame opening FR-O in a plan view. The deposition openings MK-O may define an area on which a deposition pattern is formed on the manufacturing substrate M-SUB. The deposition material DM may be formed in a pattern corresponding to the deposition openings MK-O on a deposition surface of the manufacturing substrate M-SUB by passing through the frame opening FR-O and the deposition openings MK-O. In an embodiment, the deposition pattern may correspond to at least one of the patterns or functional layers of the display panel DP (see, e.g., FIG. 2).

The mask MK may include a material having high durability. For example, the mask MK may include a carbon nanotube fiber. As a durability of the mask MK is improved, damage to the mask MK due to external impact may be prevented.

In the deposition process, the mask MK may be disposed adjacent to the manufacturing substrate M-SUB. According to an embodiment, the deposition process may be performed while the mask MK contacts the manufacturing substrate M-SUB. The mask used to manufacture a display panel having a high resolution may include the deposition openings having fine sizes and may be vulnerable to external impact due to a thin thickness of the mask. Thus, the mask may be damaged due to contact with the manufacturing substrate M-SUB in the deposition process or impact by a cleaning solution in a cleaning process. However, the mask MK may include a carbon nanotube fiber having excellent durability, and damage to the mask MK may be prevented. As the damage to the mask MK is prevented, costs required for manufacturing a new mask or repairing a damaged mask may be reduced. Further, as the durability of the mask MK is improved, the mask MK may be provided as a shadow mask used for manufacturing the display panel having a high resolution.

The stage ST may be disposed between the deposition part EU and the fixing part PU and support the frame FR. The stage ST may be disposed outside a path of the deposition material DM supplied from the deposition part EU toward the manufacturing substrate M-SUB.

The stage ST may provide a seating surface on which the frame FR is seated, and the seating surface may be parallel to the first direction DR1 and the second direction DR2. According to an embodiment, the seating surface of the stage ST may be provided parallel to the bottom surface of the chamber CB, so that a horizontal deposition process may be performed on the manufacturing substrate M-SUB. However, the disclosure is not limited thereto, and the seating surface of the stage ST may be provided perpendicular to the bottom surface of the chamber CB, so that a vertical deposition process may be performed on the manufacturing substrate M-SUB.

Referring to FIG. 2, at least one of the patterns and functional layers included in the display panel DP may be formed using the deposition device DE (see, e.g., FIG. 1) including the mask assembly MA (see, e.g., FIG. 1) according to the disclosure. FIG. 2 schematically illustrates a cross section of the display panel DP manufactured through the deposition process using the mask assembly MA (see, e.g., FIG. 1).

In an embodiment, the display panel DP may be a light emitting display panel. For example, the display panel DP may be an organic light emitting display panel, an inorganic light emitting display panel, a quantum dot light emitting display panel, or the like. A light emitting layer of the organic light emitting display panel may include an organic light emitting material, and a light emitting layer of the inorganic light emitting display panel may include an inorganic light emitting material. A light emitting layer of the quantum dot light emitting display panel may include a quantum dot or a quantum rod. Hereinafter, the display panel DP will be described as the organic light emitting display panel.

The display panel DP may include the base substrate BS, a circuit layer DP-CL, and a display element layer DP-ED.

The base substrate BS may provide a base surface on which the circuit layer DP-CL is formed. The base substrate BS may include a glass, a synthetic resin, an organic/inorganic composite material, or the like. The base substrate BS may have a single-layer structure or a multi-layer structure. For example, the multi-layered base substrate BS may include synthetic resin layers and at least one inorganic layer disposed between the synthetic resin layers.

The circuit layer DP-CL may include driving elements connected to light emitting elements ED-1, ED-2, and ED-3 and signal lines that transmit electrical signals. The circuit layer DP-CL may include a semiconductor pattern and a conductive pattern constituting a driving circuit of a pixel. After an insulating layer, a semiconductor layer, and a conductive layer are formed on the base substrate BS through processes such as a coating process, a deposition process, or the like, the semiconductor layer and the conductive layer may be patterned through multiple times of photolithography processes, and components of the circuit layer DP-CL may be formed. The light emitting elements ED-1, ED-2, and ED-3 may include first to third light emitting elements ED-1, ED-2, and ED-3 (e.g., a first light emitting element ED-1, a second light emitting element ED-2, and a third light emitting element ED-3).

The display element layer DP-ED may be disposed on the circuit layer DP-CL. The display element layer DP-ED may include the light emitting elements ED-1, ED-2, and ED-3, a pixel defining layer PDL, and an encapsulation layer TFE.

The light emitting elements ED-1, ED-2, and ED-3 may be an organic light emitting element, an inorganic light emitting element, a quantum dot light emitting element, a micro light emitting diode (LED) light emitting element, a nano LED light emitting element, or the like. However, an embodiment of the light emitting elements ED-1, ED-2, and ED-3 is not limited as long as light may be generated or intensity of light may be controlled by an electric signal.

In an embodiment, the light emitting elements ED-1, ED-2, and ED-3 may include first electrodes AE1, AE2, and AE3, a hole transport region HTR, light emitting layers EML-R, EML-G, and EML-B, an electron transport region ETR, and a second electrode CE. (Each of the light emitting element ED-1, ED-2, and ED-3 may include a first electrode AE1, AE2, or AE3, a hole transport region HTR, a light emitting layer EML-R, EML-G, or EML-B, an electron transport region ETR, and a second electrode CE.)

The first electrodes AE1, AE2, and AE3 of the light emitting elements ED-1, ED-2, and ED-3 may be arranged on the circuit layer DP-CL and may be each electrically connected to corresponding driving elements of the circuit layer DP-CL. The first electrodes AE1, AE2, and AE3 of the light emitting elements ED-1, ED-2, and ED-3 may be spaced apart from each other in a plan view.

Light emitting openings PDL-O that expose portions of the first electrodes AE1, AE2, and AE3 of the light emitting elements ED-1, ED-2, and ED-3 may be defined on the pixel defining layer PDL. The portions of the first electrodes AE1, AE2, and AE3, which are exposed by the light emitting openings PDL-O of the pixel defining layer PDL, may each correspond to light emitting areas PXA-R, PXA-G, and PXA-B. An area on which the pixel defining layer PDL is disposed may correspond to a non-light emitting area NPXA surrounding the first to third light emitting areas PXA-R, PXA-G, and PXA-B. The light emitting areas PXA-R, PXA-G, and PXA-B may include first to third light emitting areas PXA-R, PXA-G, and PXA-B (e.g., a first light emitting area PXA-R, a second light emitting area PXA-G, and a third light emitting area PXA-B).

Among the light emitting elements ED-1, ED-2, and ED-3, an area in which the first light emitting element ED-1 is disposed may correspond to the first light emitting area PXA-R, an area in which the second light emitting element ED-2 is disposed may correspond to the second light emitting area PXA-G, and an area in which the third light emitting element ED-3 is disposed may correspond to the third light emitting area PXA-B.

The first to third light emitting areas PXA-R, PXA-G, and PXA-B may be classified according to a color of light emitted from the light emitting area. For example, the first light emitting area PXA-R may be a red light emitting area that emits red light, the second light emitting area PXA-G may be a green light emitting area that emits green light, and the third light emitting area PXA-B may be a blue light emitting area that emits blue light. However, the color of the light emitted from the first to third light emitting areas PXA-R, PXA-G, and PXA-B is not limited thereto.

The pixel defining layer PDL may define an area in which light is emitted. The non-light emitting area NPXA corresponding to the pixel defining layer PDL may set boundaries between the first to third light emitting areas PXA-R, PXA-G, and PXA-B and prevent color mixing between the first to third light emitting areas PXA-R, PXA-G, and PXA-B.

The light emitting layers EML-R, EML-G, and EML-B of the first to third light emitting elements ED-1, ED-2, and ED-3 may be each disposed inside the light emitting openings PDL-O defined on the pixel defining layer PDL. Each of the light emitting layers EML-R, EML-G, and EML-B may be provided in a shape corresponding to each of the light emitting openings PDL-O. The light emitting layers EML-R, EML-G, and EML-B may be formed through a deposition process using the mask assembly MA (see, e.g., FIG. 1) according to an embodiment of the disclosure. However, the disclosure is not limited thereto, and the light emitting layers EML-R, EML-G, and EML-B of the first to third light emitting elements ED-1, ED-2, and ED-3 may be provided as a common layer having an integral shape.

Each of the light emitting layers EML-R, EML-G, and EML-B may include an organic light emitting material, an inorganic light emitting material, a quantum dot, a quantum rod, or the like. The light emitting layers EML-R, EML-G, and EML-B of the first to third light emitting elements ED-1, ED-2, and ED-3 may emit light having different colors. Materials included in the light emitting layers EML-R, EML-G, and EML-B of the first to third light emitting elements ED-1, ED-2, and ED-3 may be different from each other, and the light emitting layers EML-R, EML-G, and EML-B of the first to third light emitting elements ED-1, ED-2, and ED-3 may be deposited using different masks MK (see, e.g., FIG. 1). However, the disclosure is not necessarily limited thereto.

The hole transport region HTR, the electron transport region ETR, and the second electrode CE may be provided as a common layer integrally formed on the light emitting elements ED-1, ED-2, and ED-3. The hole transport region HTR, the electron transport region ETR, and the second electrode CE may be formed to overlap the light emitting areas PXA-R, PXA-G, and PXA-B and the non-light emitting area NPXA in a plan view. At least one of the hole transport region HTR, the electron transport region ETR, and the second electrode CE provided as the common layer may be formed using a mask, for example, an open mask.

The hole transport region HTR may be disposed between the first electrodes AE1, AE2, and AE3 and the light emitting layers EML-R, EML-G, and EML-B. The hole transport region HTR may include at least one of a hole transport layer and a hole injection layer and may further include an electron blocking layer. The electron transport region ETR may be disposed between the light emitting layers EML-R, EML-G, and EML-B and the second electrode CE. The electron transport region ETR may include at least one of an electron transport layer and an electron injection layer and may further include a hole blocking layer.

Through the driving elements of the circuit layer DP-CL, a first voltage may be applied to each of the first electrodes AE1, AE2, and AE3, and a common voltage may be applied to the second electrode CE. A hole and an electron injected into the light emitting layers EML-R, EML-G, and EML-B may be coupled and form an exciton, and as the exciton transitions to a ground state, the light emitting elements ED-1, ED-2, and ED-3 may emit light.

The encapsulation layer TFE may be disposed on the light emitting elements ED-1, ED-2, and ED-3. The encapsulation layer TFE may seal the light emitting elements ED-1, ED-2, and ED-3. The encapsulation layer TFE may include multiple thin films for improving optical efficiency of the light emitting elements ED-1, ED-2, and ED-3 or protecting the light emitting elements ED-1, ED-2, and ED-3.

The encapsulation layer TFE may include at least one inorganic film and at least one organic film. The inorganic film of the encapsulation layer TFE may protect the light emitting elements ED-1, ED-2, and ED-3 from moisture and/or oxygen. The inorganic film of the encapsulation layer TFE may be formed through a chemical vapor deposition (CVD) method and may contain (or include) silicon nitride, silicon oxide, or a combination thereof. However, the inorganic film of the encapsulation layer TFE is not limited thereto.

The organic film of the encapsulation layer TFE may protect the light emitting elements ED-1, ED-2, and ED-3 from foreign substances such as dust particles. The organic film of the encapsulation layer TFE may be formed on the inorganic film to provide a flat surface. For example, the organic film may cover particles or curves present in the inorganic film formed under the organic film. Further, the organic film may relieve stress between layers contacting the organic film. For example, the organic film of the encapsulation layer TFE may include an acrylic resin, but the disclosure is not limited thereto. The organic film of the encapsulation layer TFE may be formed through a process such as a deposition process, a spin coating process, a slit coating process, an inkjet process, or the like.

Figure 3:
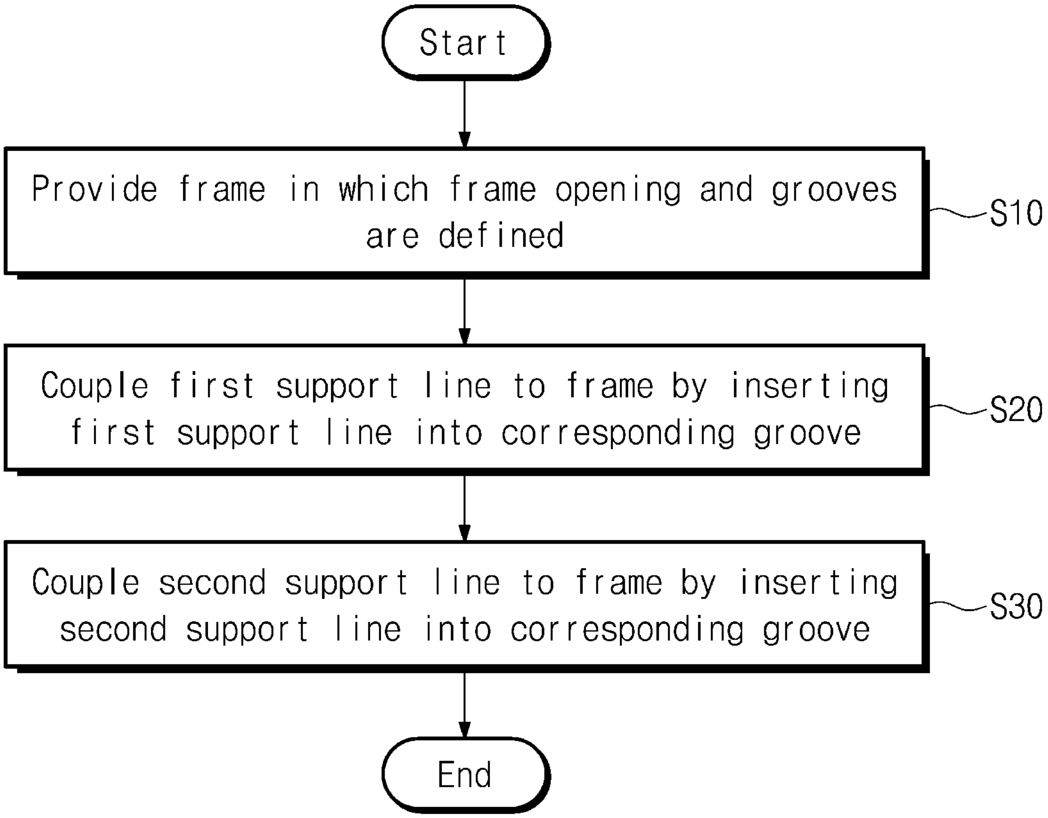
FIG. 3 is a flowchart illustrating a method of manufacturing a mask assembly according to an embodiment of the disclosure.

FIG. 3 is a flowchart illustrating a method of manufacturing a mask assembly according to an embodiment of the disclosure.

Referring to FIG. 3, the method of manufacturing a mask assembly according to an embodiment may include an operation S10 of providing a frame on which a frame opening and grooves are defined, an operation S20 of inserting a first support line into a corresponding groove and coupling the first support line to the frame, and an operation S30 of inserting a second support line into a corresponding groove and coupling the second support line to the frame.

The frame provided in the operation S10 of providing the frame may define a frame opening formed to pass through the frame, and grooves formed as a portion of the frame is recessed. The grooves may be arranged in a direction.

The operation S20 of coupling of the first support line to the frame may include an operation of fixing ends of the first support line to a gripper and tensioning the first support line in the direction, an operation of aligning the first support line on a corresponding groove among the grooves and inserting the first support line into the corresponding groove, and an operation of positioning the ends of the first support line on an outer surface of the frame and coupling the outer surface of the frame to the first support line.

The operation S30 of coupling of the second support line to the frame may include an operation of fixing ends of the second support line to the gripper and tensioning the second support line in another direction, an operation of aligning the second support line on a corresponding groove among the grooves and inserting the second support line into the groove, and an operation of positioning the ends of the second support line on the outer surface of the frame and coupling the outer surface of the frame to the second support line. The another direction and the direction in which the first support line is tensioned may be a different direction.

In the method of manufacturing a mask assembly according to the disclosure, the mask assembly including a mask including the first support line and the second support line may be manufactured by inserting the first support line and the second support line into the corresponding grooves and coupling the first support line and the second support line to the frame. Each operation will be described in detail with reference to the following drawings.

Figure 4:
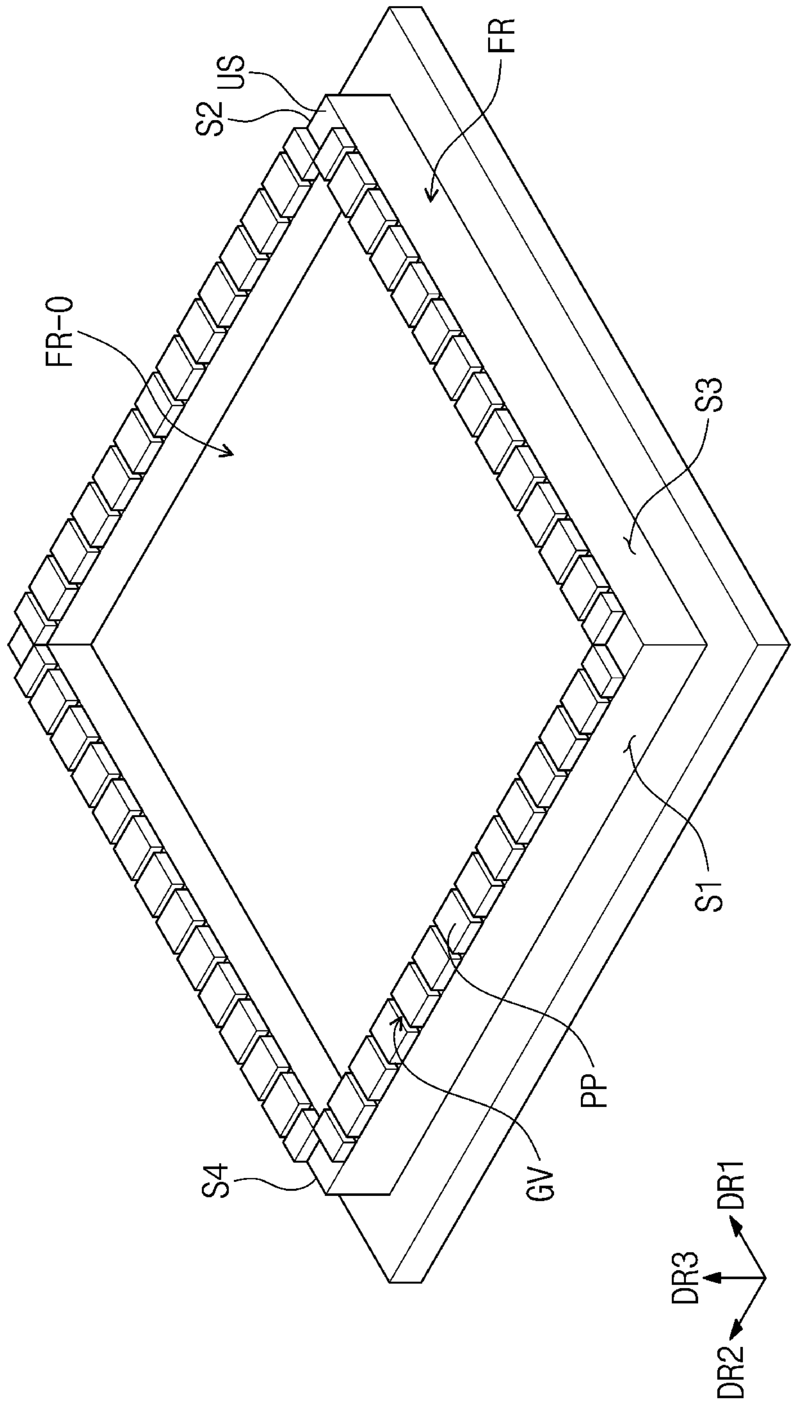
FIG. 4 is a schematic perspective view of a frame according to an embodiment of the disclosure.

FIG. 4 is a schematic perspective view of the frame FR according to an embodiment of the disclosure. The frame FR illustrated in FIG. 4 may correspond to the frame FR provided in the operation S10 of providing the frame (see, e.g., FIG. 3).

Referring to FIG. 4, the frame FR may include side walls S1, S2, S3, and S4. The frame opening FR-O may be defined by an inner surface of the walls S1, S2, S3, and S4 connected to each other. The side walls S1, S2, S3, and S4 connected to each other may surround the frame opening FR-O in a plan view. Outer surfaces of the side walls S1, S2, S3, and S4 connected to each other may be opposite to the inner surfaces of the side walls S1, S2, S3, and S4 and may form an outer surface of the frame FR. The side walls S1, S2, S3, and S4 may include first to fourth side walls S1, S2, S3, and S4 (e.g., a first side wall S1, a second side wall S2, a third side wall S3, and a fourth side wall S4).

Each of the first side wall S1 and the second side wall S2 may extend in the second direction DR2. The first side wall S1 and the second wall S2 may face each other in the first direction DR1 with the frame opening FR-O interposed between the first side wall S1 and the second side wall S2.

The third side wall S3 may extend in the first direction DR1 and may be coupled to an end of the first side wall S1 and an end of the second side wall S2. The first side wall S1 and the second side wall S2 may be connected to each other through the third side wall S3. The fourth side wall S4 may extend in the first direction DR1 and may be connected to another end of the first side wall S1 and another end of the second side wall S2. The third side wall S3 and the fourth side wall S4 may face each other in the second direction DR2 with the frame opening FR-O interposed between the third side wall S3 and the fourth side wall S4.

The first to fourth side walls S1, S2, S3, and S4 may include a same material and may be integral with each other. The first to fourth side walls S1, S2, S3, and S4 may include a material having rigidity. For example, the first to fourth side walls S1, S2, S3, and S4 may include a metal such as stainless steel (SS), an invar alloy, nickel (Ni), cobalt (Co), or a combination thereof. However, a material of the first to fourth side walls S1, S2, S3, and S4 is not limited thereto.

The frame FR may include protrusions PP. The protrusions PP may be disposed on an upper surface US of the first to fourth side walls S1, S2, S3, and S4 connected to each other. The protrusions PP arranged adjacent to each other in a direction may form grooves GV and be spaced apart from each other. Thus, the multiple grooves GV may be defined in the frame FR by the protrusions PP spaced apart from each other in the direction.

The protrusions PP arranged on the first side wall S1 or the second side wall S2 may be arranged to form the grooves GV arranged in the second direction DR2. A separation space between the protrusions PP arranged on the first side wall S1 or the second side wall S2 and adjacent to each other in the second direction DR2 may correspond to the groove GV. The grooves GV formed on the first side wall S1 or the second side wall S2 by the protrusions PP arranged on the first side wall S1 or the second side wall S2 may be arranged in the second direction DR2.

The protrusions PP arranged on the third side wall S3 or the fourth side wall S4 may be arranged to form the grooves GV in the first direction DR1. A separation space between the protrusions PP arranged on the third side wall S3 or the fourth side wall S4 and adjacent to each other in the first direction DR1 may correspond to the groove GV. The grooves GV formed on the third side wall S3 or the fourth side wall S4 by the protrusions PP arranged on the third side wall S3 or the fourth side wall S4 may be arranged in the first direction DR1.

The protrusions PP may include a material having rigidity. For example, the protrusions PP may include a metal such as stainless steel (SS), an invar alloy, nickel (Ni), cobalt (Co), or a combination thereof. The protrusions PP and the first to fourth side walls S1, S2, S3, and S4 may include a same material. The protrusions PP and the first to fourth side walls S1, S2, S3, and S4 may be integral with each other. However, the disclosure is not limited thereto, and the protrusions PP and the first to fourth side wall S1, S2, S3, and S4 may include different materials.

The size and shape of the protrusions PP illustrated in FIG. 4 are not limited to the embodiment illustrated in FIG. 4 as long as the protrusions PP are arranged and spaced apart from each other in a direction and form the grooves GV.

Figure 5:
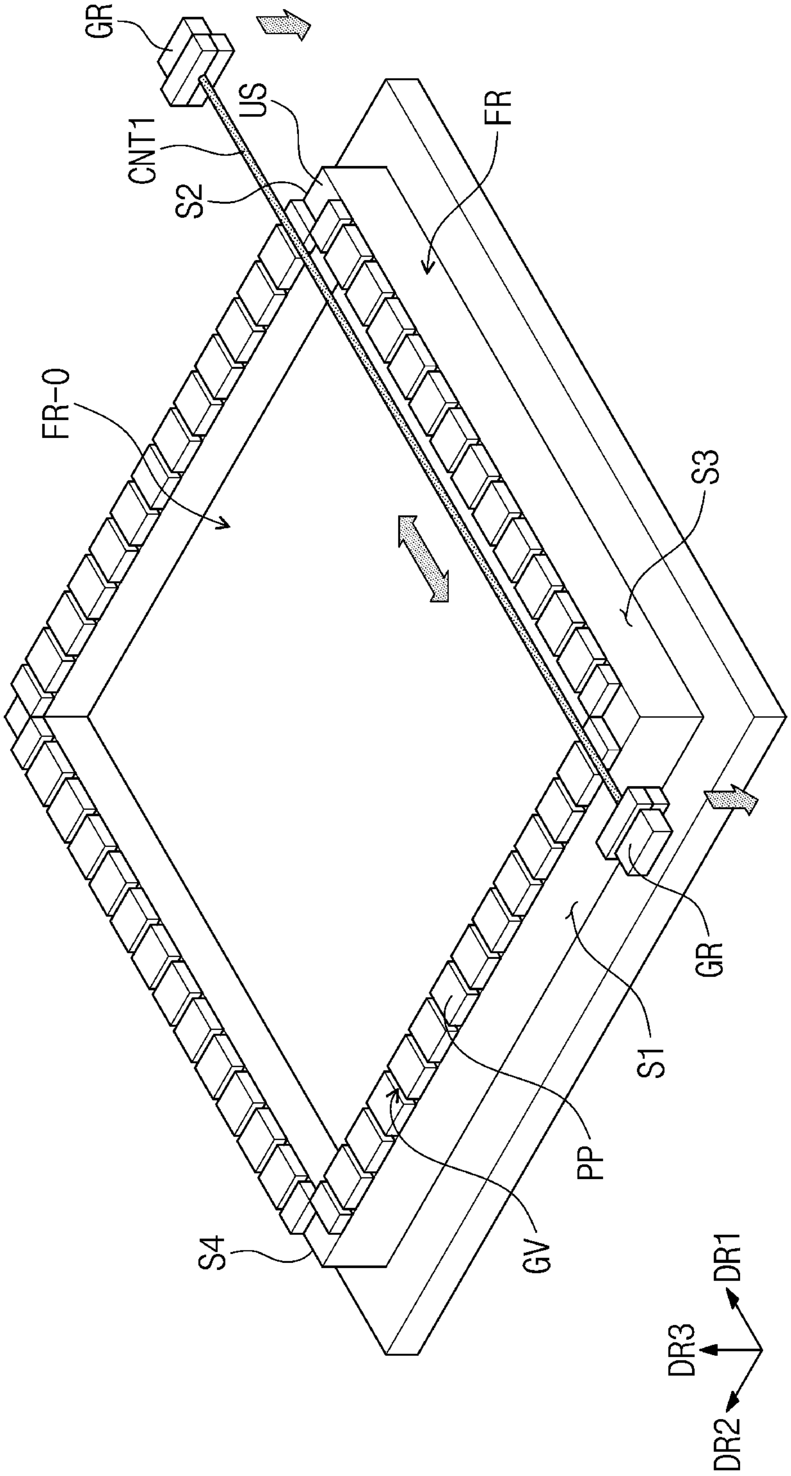
FIG. 5 is a schematic perspective view illustrating an operation of a method of manufacturing a mask assembly according to an embodiment of the disclosure.

FIG. 5 is a schematic perspective view illustrating an operation of the method of manufacturing a mask assembly according to an embodiment of the disclosure. An operation included in FIG. 5 may correspond to an operation S20 (see, e.g., FIG. 3) of coupling a first support line CNT1 to (or onto) the frame FR.

Referring to FIG. 5, the first support line CNT1 may be provided on the frame FR. The first support line CNT1 may be provided on the frame FR in a state in which both ends (hereinafter, referred to as a first end and a second end) of the first support line CNT1 are fixed to grippers GR. The gripper GR gripping the first end of the first support line CNT1 and the gripper GR gripping the second end of the first support line CNT1 may tension the first support line CNT1 in opposite directions parallel to the first direction DR1. In an embodiment, the first support line CNT1 may be tensioned in a direction parallel to the first direction DR1 by the grippers GR and may extend in the first direction DR1.

The first support line CNT1 may include a material having durability. For example, the first support line CNT1 may include a carbon nanotube fiber. The first support line CNT1 may be carbon nanotube fibers having a diameter in a range of about several to about several tens of micrometers (μm) in a cross-sectional view.

The grippers GR may align the first support line CNT1 on the frame FR and the first support line CNT1 may be inserted into corresponding grooves GV among the grooves GV. For example, a portion adjacent to the first end of the first support line CNT1 fixed to a gripper GR may be aligned on a corresponding groove GV among the grooves GV formed on the first side wall S1. A portion adjacent to the second end of the first support line CNT1 fixed to another gripper GR may be aligned on a corresponding groove GV among the grooves GV formed on the second side wall S2.

The first support line CNT1 may be inserted into a groove GV positioned on the first side wall S1 and another groove GV positioned on the second side wall S2 parallel to the groove GV in the first direction DR1, and the first support line CNT1 may extend in the first direction DR1 and may be coupled to the frame FR. Thus, the first support line CNT1 may cross the frame opening FR-O between the first side wall S1 and the second side wall S2 and overlap the frame opening FR-O in a plan view.

Figure 6A:
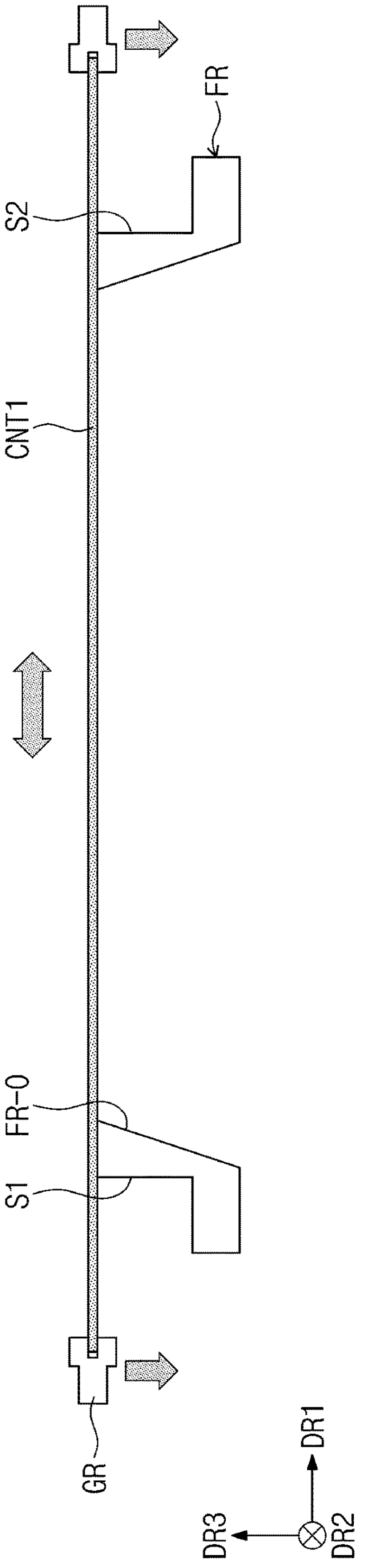
FIGS. 6A to 6C are schematic cross-sectional views sequentially illustrating operations of a method of manufacturing a mask assembly according to an embodiment of the disclosure.
Figure 6B:
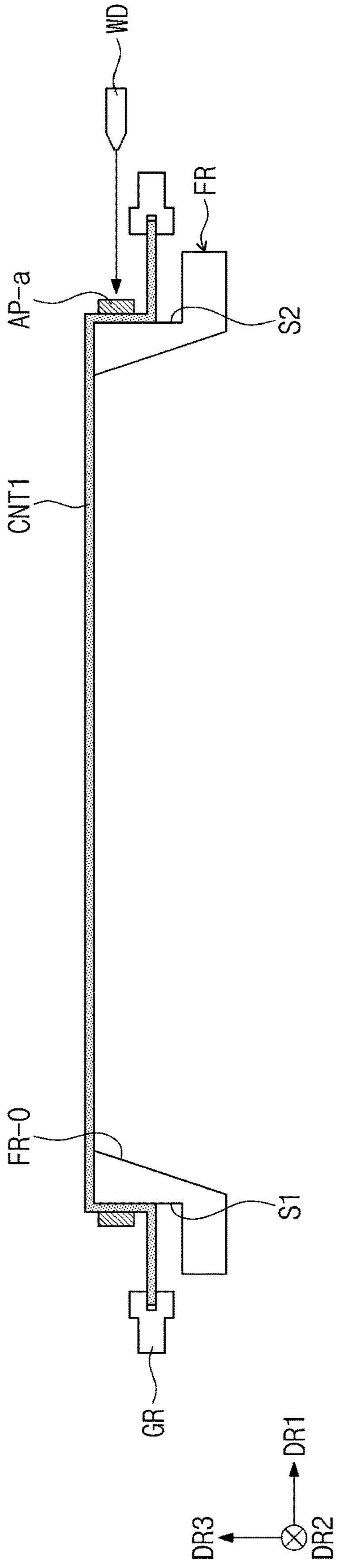
Figure 6C:
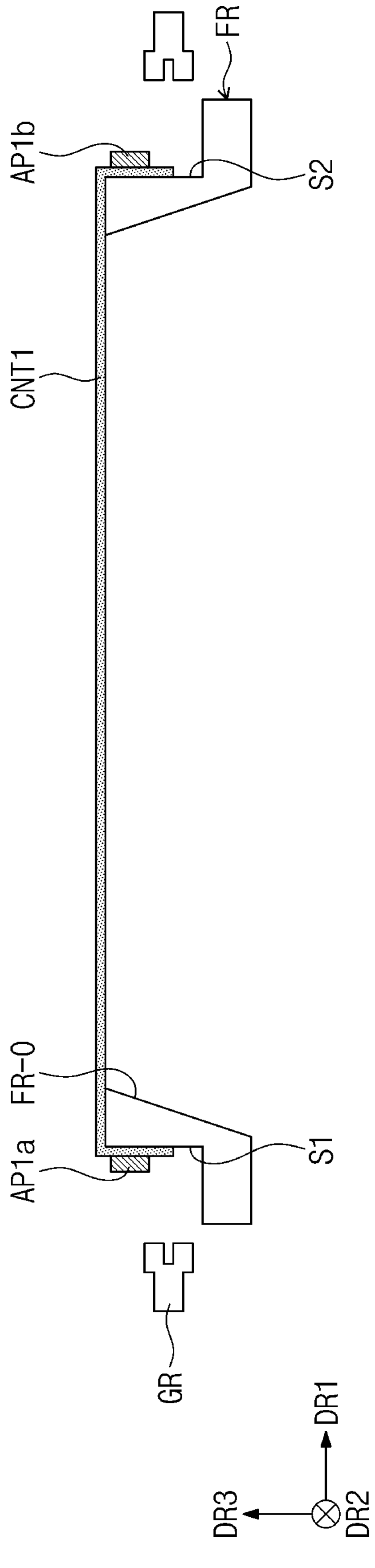

The operation of the coupling of the first support line CNT1 to the frame FR is illustrated in more detail in FIGS. 6A to 6C. Hereinafter, the operation of coupling the first support line CNT1 to the frame FR will be described with reference to FIGS. 6A to 6C.

FIGS. 6A to 6C are schematic cross-sectional views sequentially illustrating operations of the method of manufacturing a mask assembly according to an embodiment of the disclosure. The operations illustrated in FIGS. 6A to 6C may correspond to an operation S20 of coupling the first support line CNT1 to (or onto) the frame FR.

Referring to FIGS. 5 and 6A, after the grippers GR and the first support line CNT1 are aligned and the first support line CNT1 is positioned on the corresponding grooves GV, the grippers GR may move downward and insert the first support line CNT1 into the corresponding grooves GV. The grippers GR may apply a tensile force to the first support line CNT1 in a direction parallel to the first direction DR1 and may arrange the first support line CNT1 on the frame FR.

Referring to FIGS. 6A and 6B, the grippers GR may move downward, and portions adjacent to the first end and the second end of the first support line CNT1 may be positioned on outer surfaces of the first and second side walls S1 and S2. The portion adjacent to the first end of the first support line CNT1 fixed to the gripper GR may be disposed on the first side wall S1, and the portion adjacent to the second end of the first support line CNT1 fixed to the another gripper GR may be disposed on the second side wall S2. The portion adjacent to the first end of the first support line CNT1 may be bent from an upper surface of the first side wall S1 in a thickness direction (for example, the third direction DR3) of the frame FR and disposed on an outer surface of the first side wall S1. The portion adjacent to the second end of the first support line CNT1 may be bent from an upper surface of the second side wall S2 in the thickness direction of the frame FR and disposed on an outer surface of the second side wall S2.

Coupling members AP-a may be provided on portions of the first support line CNT1 positioned on the outer surfaces of the first side wall S1 and the second side wall S2. For example, the coupling members AP-a may be provided on a position, in which welding is required, by a transfer device. The coupling members AP-a may include a material that can be melted by heat, light, or the like and couple the first support line CNT1 and the frame FR.

A coupling device WD may be provided on the coupling member AP-a. The coupling device WD may be a welding device that provides heat, light, or the like. The coupling device WD may be aligned on the coupling member AP-a to be processed and may irradiate the coupling member AP-a with heat, light, or the like. The coupling device WD may move so that, after a coupling member AP-a is welded on a portion of the first support line CNT1, the coupling device WD is positioned on another coupling member AP-a.

FIG. 6B schematically illustrates an operation of coupling the first support line CNT1 and the frame FR by welding the coupling member AP-a to the first support line CNT1 by irradiating heat, light, or the like. However, a method of coupling the first support line CNT1 and the frame FR is not limited thereto. For example, the coupling member AP-a may be a fastening structure coupled to the side walls of the frame FR to fix the first support line CNT1 to the outer surface of the frame FR.

Referring to FIGS. 6B and 6C, a portion of the first support line CNT1 disposed on the outer surface of the first side wall S1 may be fixed to the first side wall S1 by a first coupling portion AP1*a*. A portion of the first support line CNT1 disposed on the outer surface of the second side wall S2 may be fixed to the second side wall S2 by a second coupling portion AP1*b*. The first coupling portion AP1*a* and the second coupling portion AP1*b* may correspond to portions formed by welding the coupling member AP-a on the first support line CNT1. However, the first coupling portion AP1*a* and the second coupling portion AP1*b* are not limited as long as the coupling portions AP1*a*, AP1*b* fixes the first support line CNT1 to the outer surface of the frame FR.

After a process of coupling the first support line CNT1 to the outer surface of the frame FR is completed, the grippers GR may be removed from the first support line CNT1. After the grippers GR are removed from the first support line CNT1, the grippers GR may provide another first support line CNT1 onto the frame FR.

The first support line CNT1 coupled to (or onto) the frame FR may extend from the outer surface of the first side wall S1, through the upper surface of the first side wall S1, the frame opening FR-O, the upper surface of the second side wall S2, to the outer surface of the second side wall S2. The first end of the first support line CNT1 may be positioned on the outer surface of the first side wall S1, and the second end of the first support line CNT1 may be positioned on the outer surface of the second side wall S2. A portion of the first support line CNT1 extending in the first direction DR1 may overlap the frame opening FR-O in a plan view.

FIGS. 5 and 6A to 6C schematically illustrate operations in which a first support line CNT1 is provided and coupled to the frame FR. However, after the first support line CNT1 is coupled to the frame FR, multiple other first support lines CNT1 may be sequentially provided and coupled onto the frame FR through the above operations.

Figure 7:
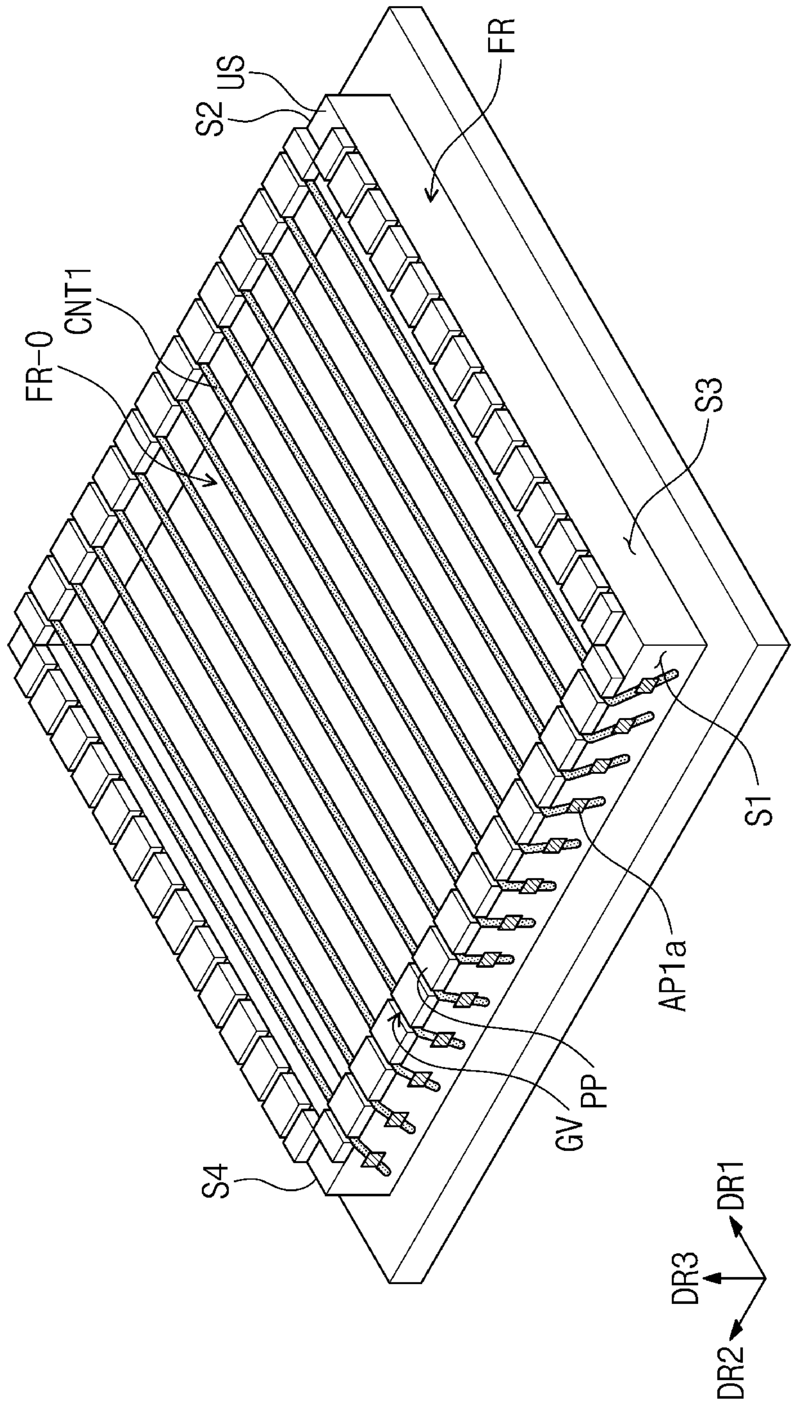
FIG. 7 is a schematic perspective view illustrating an operation of a method of manufacturing a mask assembly according to an embodiment of the disclosure.

FIG. 7 is a schematic perspective view illustrating an operation of the method of manufacturing a mask assembly according to an embodiment of the disclosure. FIG. 7 schematically illustrates a state in which the multiple first support lines CNT1 are coupled to (or onto) the frame FR. Each of the first support lines CNT1 may be coupled to the frame FR through the above-described method.

Referring to FIG. 7, the first support lines CNT1 may extend in the first direction DR1 and be coupled onto the first and second side walls S1 and S2 of the frame FR. For example, the first support lines CNT1 may be coupled onto the outer surfaces of the first and second side walls S1 and S2 and overlap the frame opening FR-O in a plan view. For example, the first ends of the first support lines CNT1 may be arranged on the outer surface of the first side wall S1, and portions adjacent to the first ends of the first support lines CNT1 may be coupled to the first side wall S1 by the first coupling portions AP1*a*. Likewise, the second ends of the first support lines CNT1 may be arranged on the outer surface of the second side wall S2, and portions adjacent to the second ends of the first support lines CNT1 may be coupled to the second side wall S2 by the second coupling portions AP1*b* (see, e.g., FIG. 6C). Portions of the first support lines CNT1 extending in the first direction DR1 may overlap the frame opening FR-O in a plan view.

FIG. 7 schematically illustrates multiple first coupling portions AP1*a* arranged on the outer surface of the first side wall S1 and coupled to the first support lines CNT1. However, the disclosure is not limited thereto. The first coupling portions AP1*a* may be provided as an integral coupling portion extending in a direction parallel to the outer surface of the first side wall S1 (for example, the second direction DR2) and overlapping the first support lines CNT1 in a plan view, and the integral coupling portion may couple the first support lines CNT1 to the first side wall S1.

The first support lines CNT1 may be inserted into the corresponding grooves GV among the grooves GV positioned on the first side wall S1 or the second side wall S2. The first support lines CNT1 inserted into the corresponding grooves GV may be arranged and spaced apart from each other in the second direction DR2. Thus, an interval between the grooves GV of the frame FR may be designed in consideration of an arrangement of the first support lines CNT1.

Figure 8:
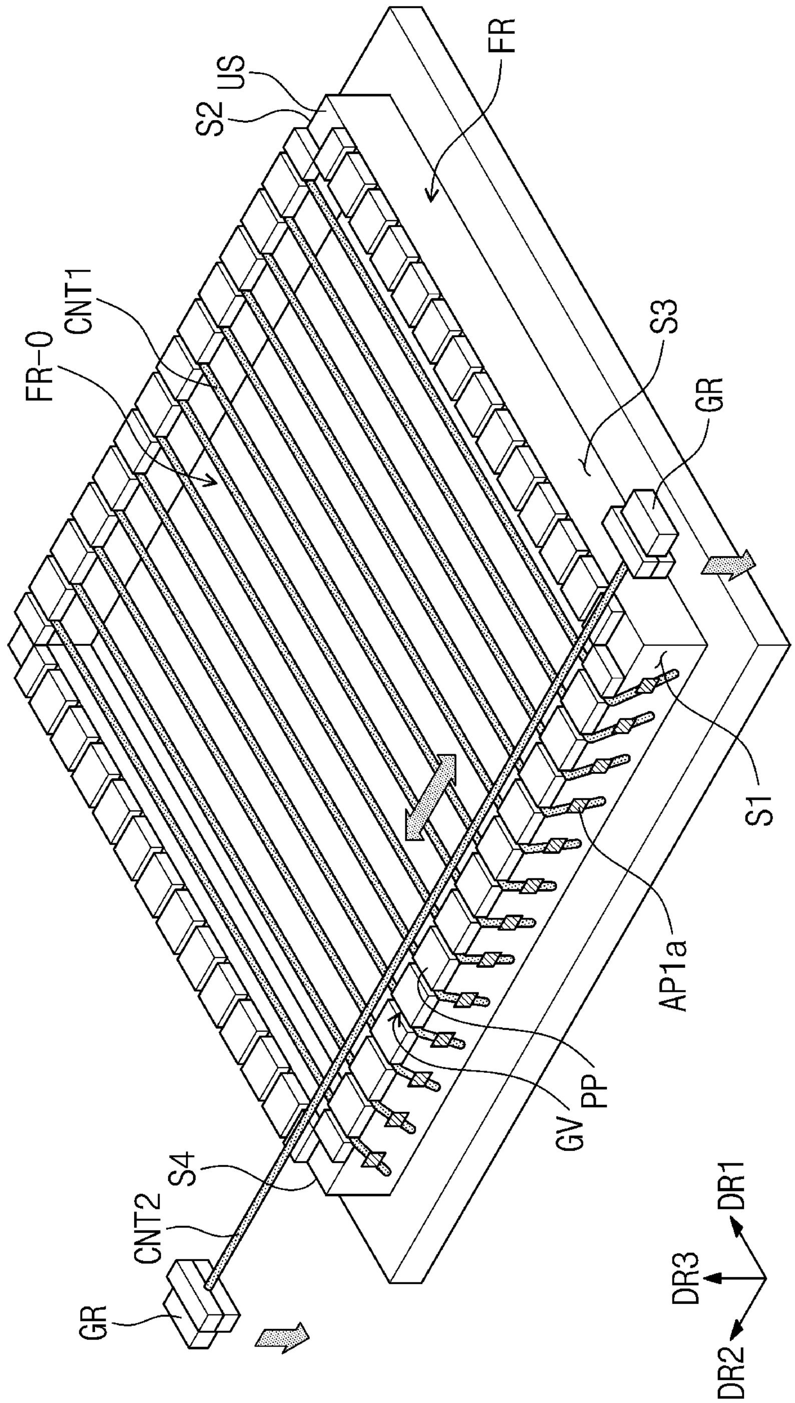
FIG. 8 is a schematic perspective view illustrating an operation of a method of manufacturing a mask assembly according to an embodiment of the disclosure.

FIG. 8 is a schematic perspective view illustrating an operation of the method of manufacturing a mask assembly according to an embodiment of the disclosure. An operation included in FIG. 8 may correspond to the operation S30 (see, e.g., FIG. 3) of coupling a second support line CNT2 onto the frame FR.

Referring to FIG. 8, the second support line CNT2 may be provided on the frame FR to which the first support lines CNT1 are coupled. The second support line CNT2 may be provided on the frame FR in a state in which both ends (hereinafter, referred to as a third end and a fourth end) of the second support line CNT2 are fixed to the grippers GR. The gripper GR gripping the third end of the second support line CNT2 and the gripper GR gripping the fourth end of the second support line CNT2 may tension the second support line CNT2 in opposite directions parallel to the second direction DR2. In an embodiment, the second support line CNT2 may be tensioned in a direction parallel to the second direction DR2 by the grippers GR and may extend in the second direction DR2.

The second support line CNT2 may include a material having durability. For example, the second support line CNT2 may include a carbon nanotube fiber. The second support line CNT2 may be carbon nanotube fibers having a diameter in a range of about several to about several tens of micrometers (μm) in a cross-sectional view.

The grippers GR may align the second support line CNT2 on the frame FR and the second support line CNT2 may be inserted into the corresponding grooves GV among the grooves GV. For example, a portion adjacent to the third end of the second support line CNT2 fixed to a gripper GR may be aligned on a corresponding groove GV among the grooves GV formed on the third side wall S3. A portion adjacent to the fourth end of the second support line CNT2 fixed to another gripper GR may be aligned on a corresponding groove GV among the grooves GV formed on the fourth side wall S4.

The second support line CNT2 may be inserted into a groove GV positioned on the third side wall S3 and another groove GV positioned on the fourth side wall S4 parallel to the groove GV in the second direction DR2, and the second support line CNT2 may extend in the second direction DR2 and may be coupled to (or onto) the frame FR. The second support line CNT2 may cross the frame opening FR-O between the third side wall S3 and the fourth side wall S4 and overlap the frame opening FR-O in a plan view. Further, the second support line CNT2 may cross and overlap the first support line CNT1 in a plan view.

The second support line CNT2 and the first support line CNT1 may be different only in terms of an extension direction and a position coupled to the frame FR, and the first support line CNT1 and the second support line CNT2 may be coupled to the frame FR by a same method as that illustrated in FIGS. 6A to 6C.

The grippers GR may move downward, and the third end of the second support line CNT2 may be positioned on an outer surface of the third side wall S3 and the fourth end of the second support line CNT2 may be positioned on an outer surface of the fourth side wall S4. Accordingly, the second support line CNT2 may extend from the outer surface of the third side wall S3, through the upper surface of the third side wall S3, the frame opening FR-O, the upper surface of the fourth side wall S4, to the outer surface of the fourth side wall S4 and may be disposed on the frame FR.

After the second support line CNT2 is disposed on the frame FR, coupling members may be provided on portions of the second support line CNT2 each positioned on the outer surfaces of the third side wall S3 and the fourth side wall S4. After the coupling device is provided on the coupling members, the coupling members may be irradiated with heat, light, or the like, and the coupling members may be welded and portions of the second support line CNT2 may be coupled to the outer surface of the frame FR. However, a method of coupling the second support line CNT2 and the frame FR is not limited to the welding. For example, the second support line CNT2 may be coupled to the frame FR by a fastening structure.

FIG. 8 illustrates that one second support line CNT2 is provided. However, the disclosure is not limited thereto, and after one second support line CNT2 is coupled to (or onto) the frame FR, multiple other second support lines CNT2 may be sequentially provided and coupled to the frame FR through the above operations.

Figure 9:
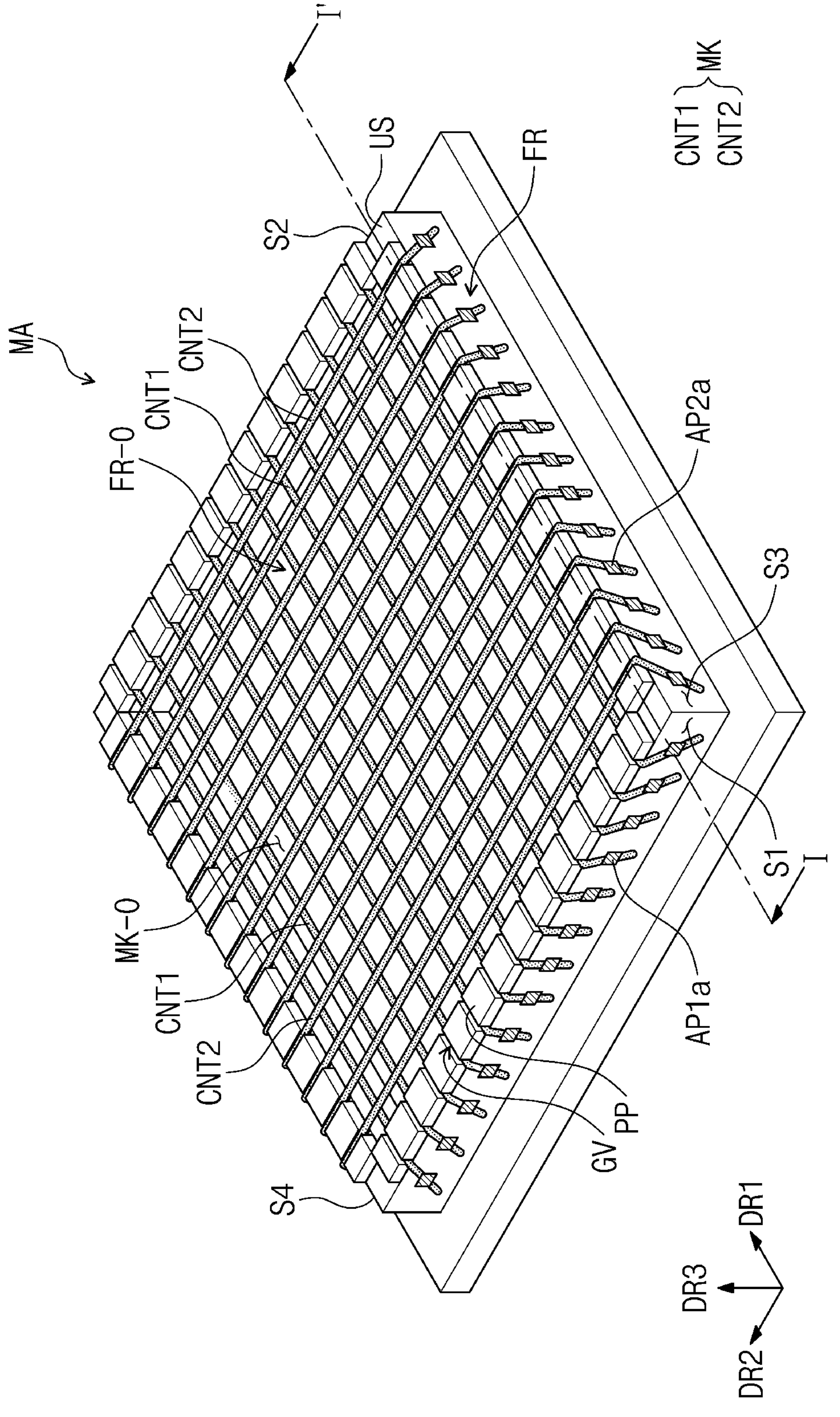
FIG. 9 is a schematic perspective view illustrating a mask assembly according to an embodiment of the disclosure.

FIG. 9 is a schematic perspective view of the mask assembly MA according to an embodiment of the disclosure. The mask assembly MA of FIG. 9 may be the mask assembly MA manufactured by the above-described method of manufacturing a mask assembly. The above description may be applied to each of the support lines CNT1, CNT2.

Referring to FIG. 9, each of the first support lines CNT1 may extend through the frame opening FR-O in the first direction DR1, may be bent to the thickness direction of the frame FR from a portion of each of the first support lines CNT1 extending in the first direction DR1, and may be coupled to the outer surfaces of the first and second side walls S1 and S2. Each of the second support lines CNT2 may extend through the frame opening FR-O in the second direction DR2, may be bent to the thickness direction of the frame FR from a portion of each of the second support lines CNT2 extending in the second direction DR2, and may be coupled to the outer surfaces of the third and fourth side walls S3 and S4.

The portions adjacent to the first ends of the first support lines CNT1 may be coupled to the first side wall S1 by the first coupling portions AP1*a*. Although not illustrated in FIG. 9, the portions adjacent to the second ends of the first support lines CNT1 may be arranged on the outer surface of the second side wall S2 and may be coupled to the second side wall S2 by the second coupling portions AP1*b* (see, e.g., FIG. 6C).

The portions adjacent to the third ends of the second support lines CNT2 may be coupled to the third side wall S3 by third coupling portions AP2*a*. Although not illustrated in FIG. 9, the portions adjacent to the fourth ends of the second support lines CNT2 may be coupled to the fourth side wall S4 by fourth coupling portions.

FIG. 9 schematically illustrates the multiple third coupling portions AP2*a* arranged on the outer surface of the third side wall S3 and coupled to the second support lines CNT2. However, the disclosure is not limited thereto. The third coupling portions AP2*a* may be provided as an integral coupling portion extending in a direction parallel to the outer surface of the third side wall S3 (for example, the first direction DR1) and overlapping the second support lines CNT2 in a plan view, and the integral coupling portion may couple the second support lines CNT2 to the third side wall S3.

The first support lines CNT1 may be inserted into the corresponding grooves GV among the grooves GV positioned on the first side wall S1 or the second side wall S2. The first support lines CNT1 inserted into the corresponding grooves GV may be arranged and spaced apart from each other in the second direction DR2. The second support lines CNT2 may be inserted into the corresponding grooves GV among the grooves GV positioned on the third side wall S3 or the fourth side wall S4. The second support lines CNT2 inserted into the corresponding grooves GV may be arranged and spaced apart from each other in the first direction DR1. Thus, an interval between the grooves GV of the frame FR may be designed in consideration of an arrangement of the first support lines CNT1 and an arrangement of the second support lines CNT2.

In an area corresponding to the frame opening FR-O, the first support lines CNT1 and the second support lines CNT2 may intersect and overlap each other in a plan view. For example, in the area corresponding to the frame opening FR-O, each of the first support lines CNT1 may extend in the first direction DR1, the first support lines CNT1 may be arranged and spaced apart from each other in the second direction DR2, each of the second support lines CNT2 may extend in the second direction DR2, and the second support lines CNT2 may be arranged and spaced apart from each other in the first direction DR1.

In the area corresponding to the frame opening FR-O, the second support lines CNT2 may be arranged above the first support lines CNT1. However, the disclosure is not limited thereto, and in the area corresponding to the frame opening FR-O, the first support lines CNT1 may be arranged above the second support lines CNT2.

The first support lines CNT1 and the second support lines CNT2 intersecting and overlapping each other in a plan view may constitute the mask MK forming the deposition openings MK-O. The mask MK according to an embodiment of the disclosure may include the first support lines CNT1 and the second support lines CNT2 intersecting each other in a plan view.

Each of the first and second support lines CNT1 and CNT2 may include a carbon nanotube fiber having excellent durability, and accordingly, durability of the mask MK may be improved. As the durability of the mask MK is improved, the mask MK may be prevented from being damaged due to contact with the manufacturing substrate M-SUB (see, e.g., FIG. 1) in the deposition process, an impact due to a process environment, or impact in the cleaning process.

Each of the deposition openings MK-O may be surrounded and defined by adjacent first support lines CNT1 in the second direction DR2 and adjacent second support lines CNT2 in the first direction DR1 and intersecting the corresponding first support lines CNT1 in a plan view. The deposition openings MK-O defined by the first and second support lines CNT1 and CNT2 may overlap the frame opening FR-O in a plan view. The deposition openings MK-O may correspond to an area in which a deposition pattern is formed on the manufacturing substrate M-SUB (see, e.g., FIG. 1) in the deposition process.

A size of the deposition openings MK-O may be adjusted by adjusting diameters of the first and second support lines CNT1 and CNT2 and the arrangement of the first and second support lines CNT1 and CNT2. As the first and second support lines CNT1 and CNT2 are provided with carbon nanotube fibers having a diameter in a range of about several to about several tens of micrometers (μm), the deposition openings MK-O having a fine size may be readily formed inside the mask MK. Further, in a process of manufacturing the mask MK, a process of etching an inorganic film or a metal film using an etchant, a laser beam, or the like to form the deposition openings MK-O may be omitted, and in the method of manufacturing a mask assembly according to an embodiment of the disclosure, precision of the process may be improved as compared to an etching process.

Figure 10A:
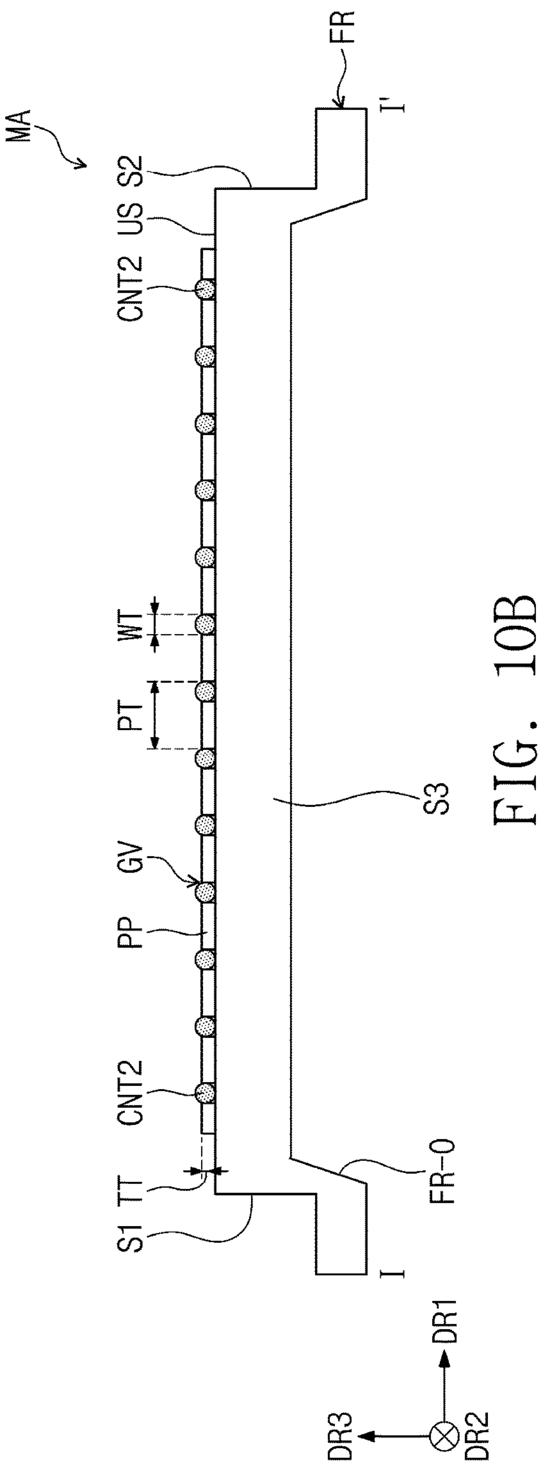
FIGS. 10A to 10C are schematic cross-sectional views of a mask assembly according to an embodiment of the disclosure.
Figure 10B:
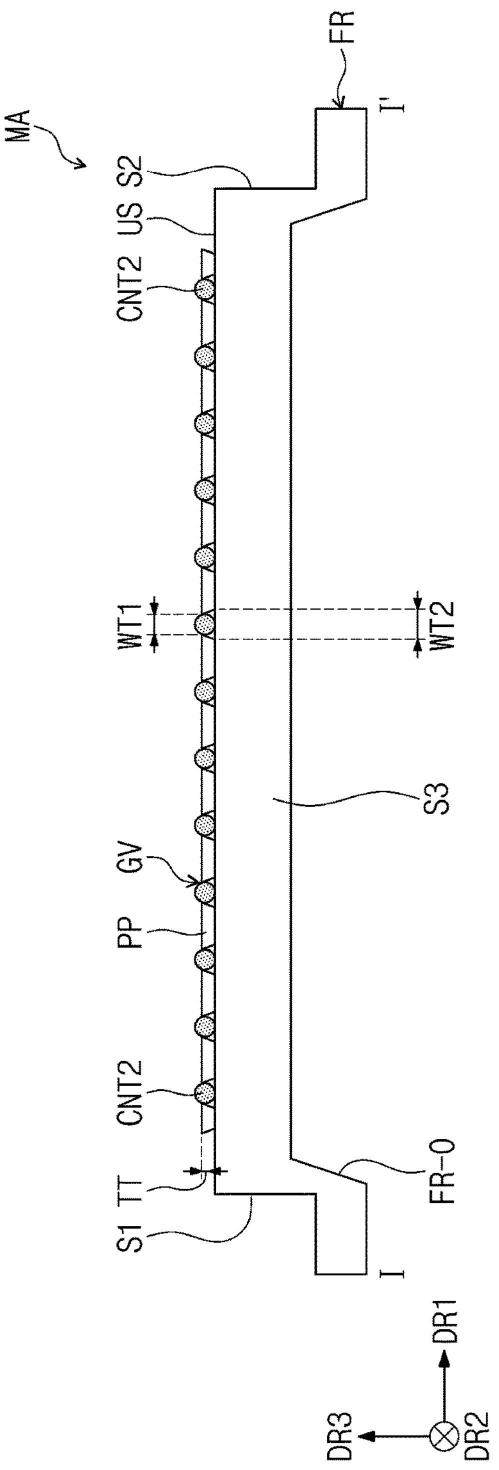
Figure 10C:
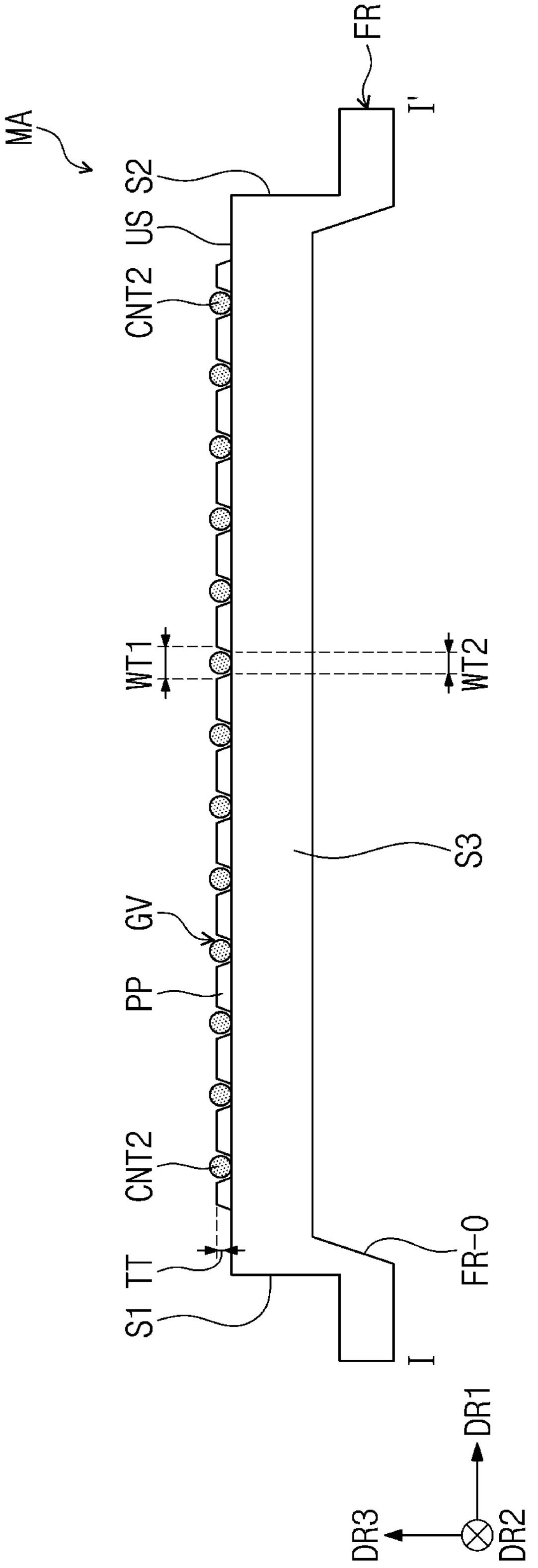

FIGS. 10A to 10C are schematic cross-sectional views of the mask assembly MA according to an embodiment of the disclosure. FIG. 10A is a schematic cross-sectional view of the mask assembly MA along line I-I' of FIG. 9 according to an embodiment, and FIGS. 10B and 10C are schematic cross-sectional views of the mask assembly MA along line I-I' of FIG. 9 according to an embodiment according to another embodiment.

FIGS. 10A to 10C schematically illustrate a cross section in which the second support lines CNT2 are arranged in the grooves GV, and the description will be made below based on the second support lines CNT2. However, the disclosure is not limited thereto, and the following description may be applied equally to the first support lines CNT1.

Referring to FIGS. 10A to 10C, the protrusions PP arranged on the third side wall S3 may be spaced apart from each other in the first direction DR1. Separation spaces between adjacent ones of the protrusions PP may each correspond to the grooves GV. The second support lines CNT2 may be each arranged inside the grooves GV.

Referring to FIG. 10A, each of the protrusions PP may have a quadrangular shape in a cross-sectional view. An angle between a bottom surface of the protrusion PP contacting the upper surface US of the third side wall S3 and a side surface of the protrusion PP connected to the bottom surface of the protrusion PP may be substantially a right angle. Accordingly, facing side surfaces of the adjacent protrusions PP in the first direction DR1 may be substantially perpendicular to the first direction DR1.

Since the protrusions PP have a quadrangular shape in a cross-sectional view, a width WT of the groove GV in the first direction DR1 may be constant along the third direction DR3 that is the thickness direction of the frame FR. For example, a distance between the bottom surfaces of the adjacent protrusions PP and a distance between upper surfaces of the adjacent protrusions PP in the first direction DR1 may be constant.

The width WT of each of the grooves GV may be greater than or equal to a diameter of the second support line CNT2. In case that the width WT of each of the grooves GV is less than the diameter of the second support line CNT2, it may be difficult to insert the second support lines CNT2 into the grooves GV. Thus, as the width WT of each of the grooves GV is greater than the diameter of the second support line CNT2, the second support lines CNT2 may be readily inserted into the grooves GV.

The protrusions PP may have a thickness TT (e.g., a predetermined or selectable thickness TT) in the third direction DR3. The thickness TT of each of the protrusions PP may correspond to a depth of each of the grooves GV. The thickness TT of each of the protrusions PP may be less than or equal to the diameter of the second support line CNT2. However, the disclosure is not necessarily limited thereto.

In the deposition process, a shadow area in which the deposition pattern is insufficiently formed because the deposition material does not sufficiently reach the area of the manufacturing substrate M-SUB due to interference by the mask MK may be formed in the manufacturing substrate M-SUB (see, e.g., FIG. 1) disposed on the mask assembly MA. As the thickness TT of each of the protrusions PP is less than the diameter of the second support line CNT2, in case that the manufacturing substrate M-SUB (see, e.g., FIG. 1) is disposed on the second support line CNT2, the manufacturing substrate M-SUB (see, e.g., FIG. 1) may be disposed more adjacent to the second support lines CNT2 than the protrusions PP. Accordingly, the shadow area due to interference by the protrusions PP may be prevented from being formed, and an area of the shadow area may be reduced.

A sum of the width of a protrusion PP among the protrusions PP and the width WT of a groove GV adjacent to the protrusion PP in the first direction DR1 may be defined as a pitch PT. The pitch PT may be designed in consideration of the required interval between the second support lines CNT2.

Referring to FIG. 10B, each of the protrusions PP may have an inverted trapezoidal shape in a cross-sectional view. Accordingly, a width of the bottom surface of the protrusion PP contacting the upper surface US of the third side wall S3 in the first direction DR1 may be less than the width of the upper surface of the protrusion PP in the first direction DR1. An angle between the bottom surface of the protrusion PP and the side surface of the protrusion PP connected to the bottom surface of the protrusion PP may be an obtuse angle exceeding 90 degrees.

Widths WT1 and WT2 of the groove GV in the first direction DR1 may vary along the third direction DR3 that is the thickness direction of the frame FR. The widths WT1 and WT2 of the groove GV may decrease as a distance from the upper surface US of the third side wall S3 in the third direction DR3 increases. A lower width WT2 of the groove GV corresponding to the interval between the bottom surfaces of the adjacent protrusions PP may be greater than an upper width WT1 of the groove GV corresponding to the interval between the upper surfaces of the protrusions PP in the first direction DR1.

The upper width WT1 of each of the grooves GV may be greater than or equal to the diameter of the second support line CNT2. Accordingly, the second support lines CNT2 may be readily inserted into the grooves GV. Since the upper width WT1 of each of the grooves GV is less than the lower width WT2 of each of the grooves GV, the second support lines CNT2 inserted into the grooves GV may be well fixed to the grooves GV.

The thickness TT of each of the protrusions PP in the third direction DR3 may correspond to the depth of each of the grooves GV. The thickness TT of each of the protrusions PP may be less than or equal to the diameter of the second support line CNT2. However, the disclosure is not necessarily limited thereto.

Referring to FIG. 10C, each of the protrusions PP may have a trapezoid shape in a cross-sectional view. Accordingly, the width of the bottom surface of the protrusion PP in the first direction DR1 may be greater than the width of the upper surface of the protrusion PP in the first direction DR1. An angle between the bottom surface of the protrusion PP and the side surface of the protrusion PP connected to the bottom surface of the protrusion PP may be an acute angle in a range of less than 90 degrees.

The widths WT1 and WT2 of the groove GV in the first direction DR1 may vary along the third direction DR3 that is the thickness direction of the frame FR. The widths WT1 and WT2 of the groove GV may increase as a distance from the upper surface US of the third side wall S3 in the third direction DR3 increases. The lower width WT2 of the groove GV corresponding to the interval between the bottom surfaces of the adjacent protrusions PP may be less than the upper width WT1 of the groove GV corresponding to the interval between the upper surfaces of the protrusions PP in the first direction DR1.

The lower width WT2 of each of the grooves GV may be greater than or equal to the diameter of the second support line CNT2. Accordingly, the second support lines CNT2 may be completely inserted into the grooves GV. Since the upper width WT1 of each of the grooves GV is greater than the lower width WT2, the second support lines CNT2 may be readily aligned on the corresponding grooves GV and inserted into the corresponding grooves GV.

The thickness TT of each of the protrusions PP in the third direction DR3 may correspond to the depth of each of the grooves GV. The thickness TT of each of the protrusions PP may be less than or equal to the diameter of the second support line CNT2. However, the disclosure is not necessarily limited thereto.

The shape of the protrusions PP in a cross-sectional view illustrated in FIGS. 10A to 10C is not limited thereto, and may be variously changed as long as the protrusions PP define the grooves GV.

Figure 11:
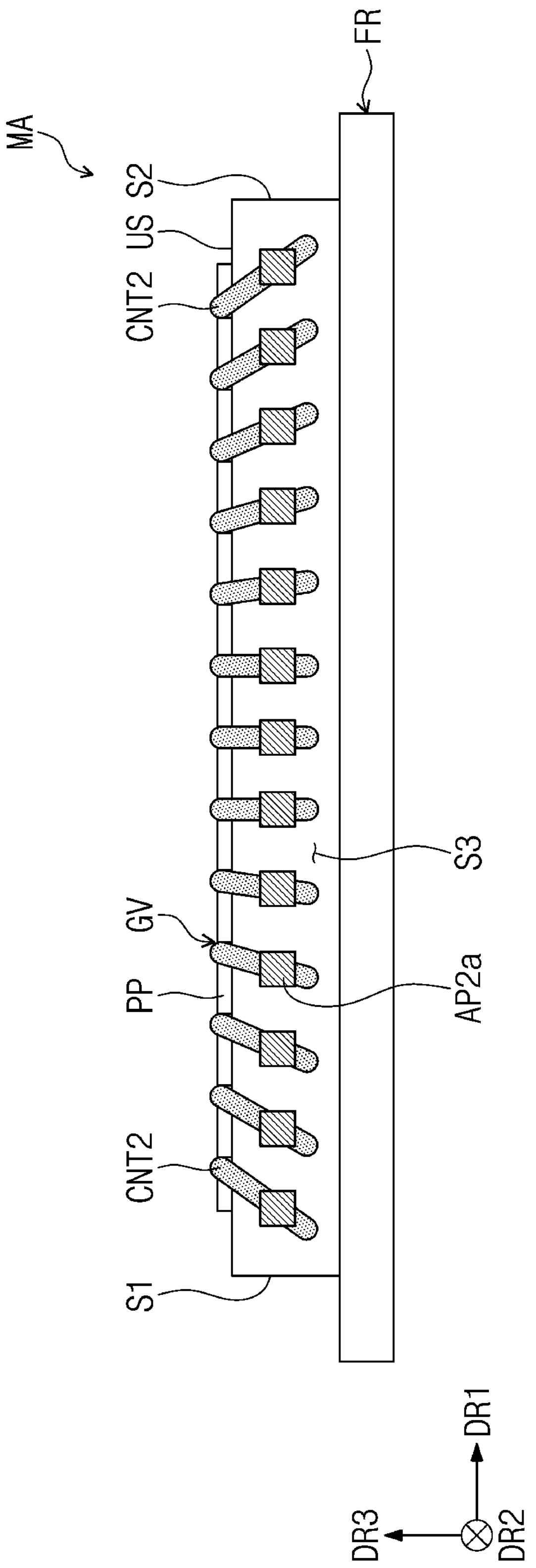
FIG. 11 is a schematic cross-sectional view of a mask assembly according to an embodiment of the disclosure.

FIG. 11 is a schematic cross-sectional view of the mask assembly MA according to an embodiment of the disclosure. FIG. 11 corresponds to a cross section in case that the outer surface of the third side wall S3 is viewed in the second direction DR2.

Referring to FIG. 11, the third end of each of the second support lines CNT2 may be disposed on the outer surface of the third side wall S3. Portions of the second support lines CNT2 adjacent to the third ends may be bent from portions of the second support lines CNT2 extending in the second direction DR2 to the thickness direction (for example, the third direction DR3) of the frame FR and may overlap the outer surface of the third side wall S3 in a cross-sectional view. The portions of the second support lines CNT2 adjacent to the third ends of the second support lines CNT2 may be coupled to the outer surface of the third side wall S3 by the third coupling portions AP2*a*.

Since the diameter of each of the second support lines CNT2 and the distance between the second support lines CNT2 are in a range of about several to about several tens of micrometers (μm), the second support lines CNT2 may be substantially densely arranged on the outer surface of the third side wall S3. Thus, since a space for welding the second support lines CNT2 is required on the outer surface of the third side wall S3, some of the second support lines CNT2 may be arranged to be bent (or tilted) with an angle (e.g., a predetermined or selectable angle) on the outer surface of the third side wall S3.

For example, a bent angle (or tilted angle) of the second support lines CNT2 may increase as the second support line CNT2 is disposed away from a center to a left or right side on the outer surface of the third side wall S3. Among the second support lines CNT2 arranged on the outer surface of the third side wall S3 in the first direction DR1, the second support lines CNT2 arranged in a central portion of the third side wall S3 may extend substantially parallel to the third direction DR3. The second support lines CNT2 may bend clockwise direction as the second support line CNT2 is disposed away from the center to the left side of the third side wall S3. The second support lines CNT2 may bend counter-clockwise direction as the second support lines CNT2 is disposed away from the center to the right side of the third side wall S3.

However, an arrangement of the second support lines CNT2 on the outer surface of the side wall of the frame FR is not limited to the embodiment of FIG. 11 as long as the second support lines CNT2 are securely coupled to the side wall of the frame FR.

Although the second support lines CNT2 arranged on the outer surface of the third side wall S3 have been schematically described, the corresponding description may be equally applied to support lines arranged on outer surfaces of other side walls of the frame FR.

Figure 12A:
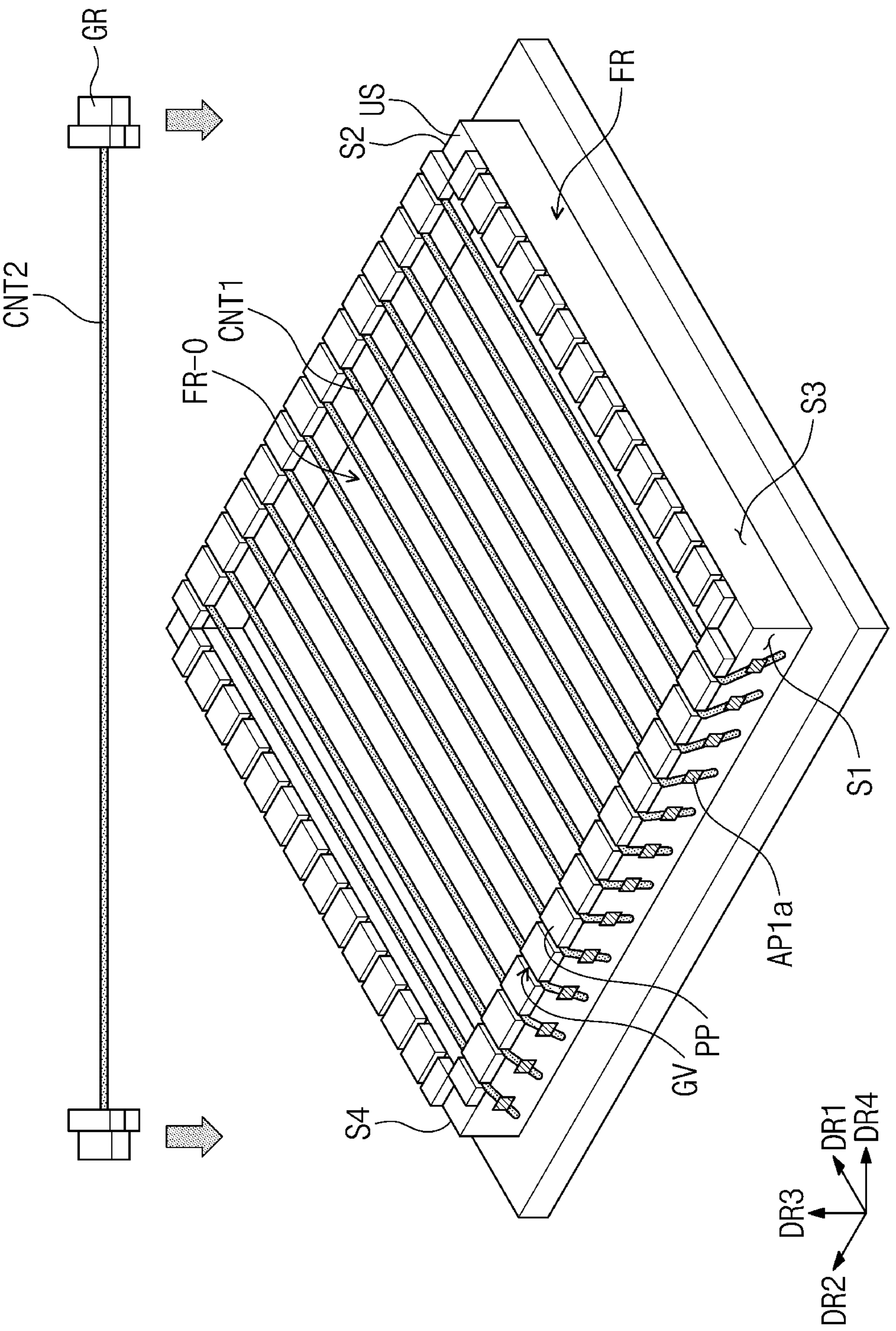
FIG. 12A is a schematic perspective view illustrating an operation of a method of manufacturing a mask assembly according to an embodiment of the disclosure.
Figure 12B:
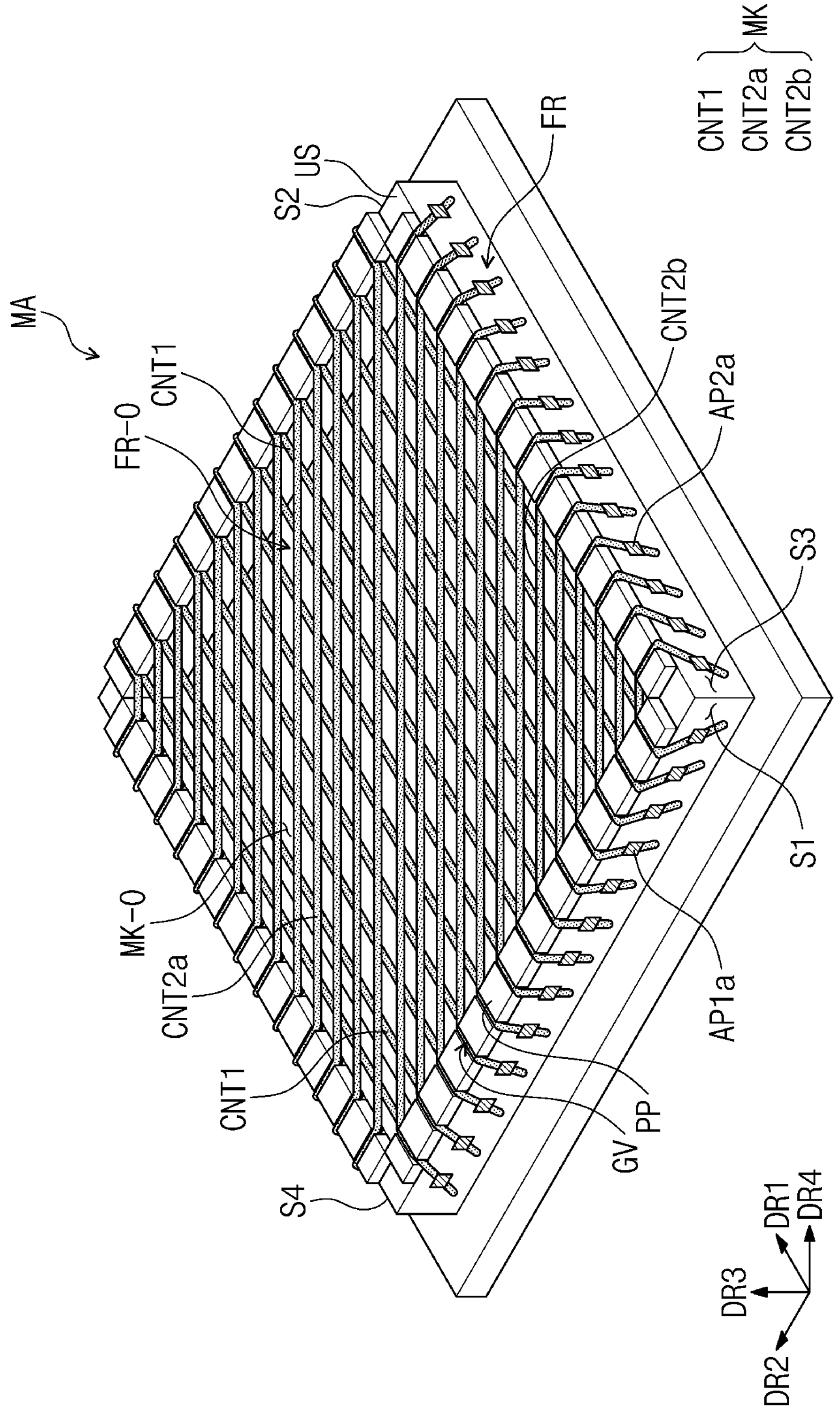
FIG. 12B is a schematic perspective view illustrating a mask assembly according to an embodiment of the disclosure.

FIG. 12A is a schematic perspective view illustrating an operation of the method of manufacturing a mask assembly according to an embodiment of the disclosure. FIG. 12B is a schematic perspective view of the mask assembly MA according to an embodiment of the disclosure. The mask assembly MA of FIG. 12B may be manufactured through the operation illustrated in FIG. 12A.

FIG. 12A may correspond to operation S30 (see, e.g., FIG. 3) of coupling the second support line CNT2 onto the frame FR to which the first support lines CNT1 are coupled. The second support line CNT2 may be provided on the frame FR in a state in which the third end and the fourth end of the second support line CNT2 are fixed to the grippers GR.

An embodiment illustrated in FIG. 12A and an embodiment of the second support line CNT2 illustrated in FIG. 8 may differ in terms of a direction in which a tensile force is applied. The grippers GR gripping the third end and the fourth end of the second support line CNT2 may tension the second support line CNT2 in opposite directions parallel to a fourth direction DR4. The fourth direction DR4 may be a direction that is parallel to a plane defined by the first direction DR1 and the second direction DR2 and intersecting the first direction DR1 and the second direction DR2. An angle between the first direction DR1 and the fourth direction DR4 may be less than 90 degrees.

The grippers GR may align the second support line CNT2 on the frame FR and the second support line CNT2 may be inserted into the corresponding grooves GV among the grooves GV. For example, a portion adjacent to the third end of the second support line CNT2 may be aligned on a corresponding groove GV among the grooves GV formed on the fourth side wall S4, and a portion adjacent to the fourth end of the second support line CNT2 may be aligned on a corresponding groove GV among the grooves GV formed on the second side wall S2.

The second support lines CNT2 inserted into the grooves GV may extend in the fourth direction DR4 and may be coupled to (or onto) the frame FR. For example, the second support line CNT2 may cross the frame opening FR-O between the second side wall S2 and the fourth side wall S4 and overlap the frame opening FR-O in a plan view. The second support line CNT2 may cross and overlap the first support line CNT1 in a plan view.

The second support line CNT2 and the first support line CNT1 may be different only in terms of an extension direction and a position coupled to the frame FR, and the first support line CNT1 and the second support line CNT2 may be coupled to the frame FR by the same method as that illustrated in FIGS. 6A to 6C.

FIG. 12A illustrates that one second support line CNT2 is provided. However, the disclosure is not limited thereto, and after one second support line CNT2 is coupled to the frame FR, multiple other second support lines CNT2 may be sequentially provided and coupled to the frame FR, and the mask assembly MA illustrated in FIG. 12B may be manufactured.

Referring to FIG. 12B, each of the first support lines CNT1 may extend through the frame opening FR-O in the first direction DR1, may be bent to the thickness direction of the frame FR from a portion of each of the first support lines CNT1 extending in the first direction DR1, and may be coupled to the outer surfaces of the first and second side walls S1 and S2. Some second support lines CNT2*a* among second support lines CNT2*a* and CNT2*b* may extend through the frame opening FR-O in the fourth direction DR4, may be bent to the thickness direction of the frame FR from portions of some second support lines CNT2*a* extending in the fourth direction DR4, and may be coupled to the outer surfaces of the second and fourth side walls S2 and S4. Another second support lines CNT2*b* among the second support lines CNT2*a* and CNT2*b* may extend through the frame opening FR-O in the fourth direction DR4, may be bent to the thickness direction of the frame FR from portions of the other second support lines CNT2*b* extending in the fourth direction DR4, and may be coupled to the outer surfaces of the first and third side walls S1 and S3.

The first support lines CNT1 may be inserted into the corresponding grooves GV among the grooves GV positioned on the first side wall S1 or the second side wall S2. The first support lines CNT1 inserted into the corresponding grooves GV may be arranged and spaced apart from each other in the second direction DR2.

Some second support lines CNT2*a* may be inserted into the corresponding grooves GV among the grooves GV positioned on the second side wall S2 or the fourth side wall S4. The second support lines CNT2*a* inserted into the corresponding grooves GV may be arranged and spaced apart from each other in a direction intersecting the fourth direction DR4 in a plan view.

Another second support lines CNT2*b* may be inserted into the corresponding grooves GV among the grooves GV positioned on the first side wall S1 or the third side wall S3. The second support lines CNT2*b* inserted into the corresponding grooves GV may be arranged and spaced apart from each other in the direction intersecting the fourth direction DR4 in a plan view. A direction in which the second support lines CNT2*a* and CNT2*b* are arranged may change according to the positions of the grooves GV into which the second support lines CNT2*a* and CNT2*b* are inserted.

In the area corresponding to the frame opening FR-O, the first support lines CNT1 and the second support lines CNT2*a* and CNT2*b* may intersect and overlap each other in a plan view. For example, in the area corresponding to the frame opening FR-O, each of the first support lines CNT1 may extend in the first direction DR1, and each of the second support lines CNT2*a* and CNT2*b* may extend in the fourth direction DR4 intersecting the first direction DR1. In the area corresponding to the frame opening FR-O, the first support lines CNT1 may be spaced apart from each other in the second direction DR2, and the second support lines CNT2*a* and CNT2*b* may be spaced apart from each other in directions intersecting the first direction DR1, the second direction DR2, and the fourth direction DR4.

The first support lines CNT1 and the second support lines CNT2*a* and CNT2*b* intersecting and overlapping each other in a plan view may constitute the mask MK forming the deposition openings MK-O. Each of the deposition openings MK-O may be surrounded and defined by the first support lines CNT1 adjacent to each other in the second direction DR2 and the second support lines CNT2*a* and CNT2*b* intersecting the corresponding first support lines CNT1 in a plan view. The deposition openings MK-O defined by the first and second support lines CNT1, CNT2*a*, and CNT2*b* may overlap the frame opening FR-O in a plan view.

The directions the first support lines CNT1 and the second support lines CNT2*a* and CNT2*b* extend and the positions of the grooves GV into which the first support lines CNT1 and the second support lines CNT2*a* and CNT2*b* are disposed may change according to a shape or area of the deposition openings MK-O.

Figure 13:
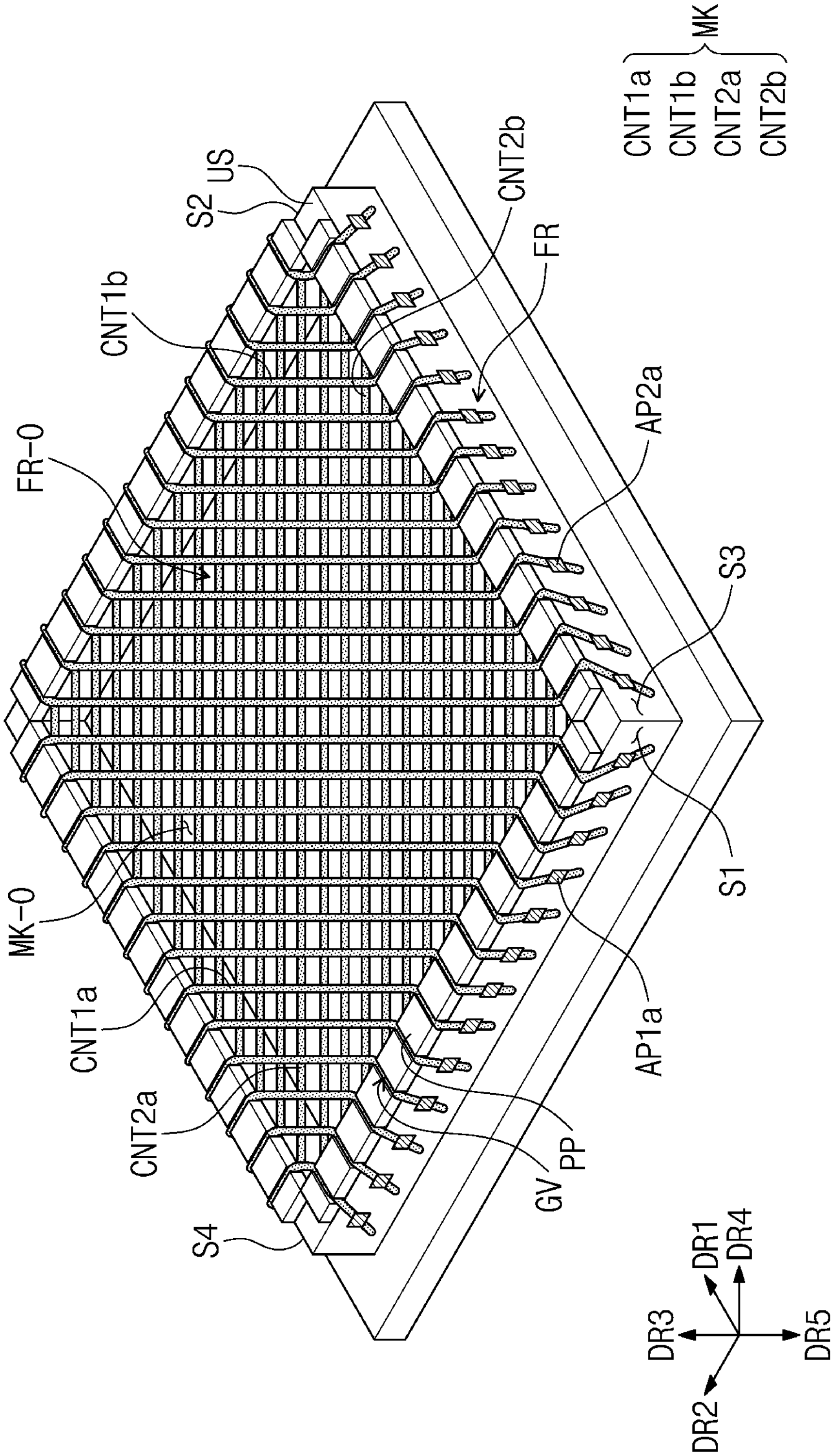
FIG. 13 is a schematic perspective view of a mask assembly according to an embodiment of the disclosure.

FIG. 13 is a schematic perspective view of the mask assembly MA according to an embodiment of the disclosure. The above description except for directions in which first support lines CNT1*a* and CNT1*b* and the second support lines CNT2*a* and CNT2*b* extend may be applied to an embodiment illustrated in FIG. 13.

The same description with reference to FIGS. 12A and 12B may be applied to the extension direction and arrangement of the second support lines CNT2*a* and CNT2*b* of FIG. 13, and hereinafter, a description will be made on the first support lines CNT1*a* and CNT1*b*.

Referring to FIG. 13, each of the first support lines CNT1*a* and CNT1*b* may extend in a fifth direction DR5. The fifth direction DR5 may be a direction that is parallel to a plane defined by the first direction DR1 and the second direction DR2 and intersecting the first direction DR1, the second direction DR2, and the fourth direction DR4.

Some first support lines CNT1*a* among the first support lines CNT1*a* and CNT1*b* may extend through the frame opening FR-O in the fifth direction DR5, may be bent to the thickness direction of the frame FR from portions of some first support lines CNT1*a* extending in the fifth direction DR5, and may be coupled to the outer surfaces of the first and fourth side walls S1 and S4. Another first support lines CNT1*b* among the first support lines CNT1*a* and CNT1*b* may extend through the frame opening FR-O in the fifth direction DR5, may be bent to the thickness direction of the frame FR from portions of the other first support lines CNT1*b* extending in the fifth direction DR5, and may be coupled to the outer surfaces of the second and third side walls S2 and S3.

Some first support lines CNT1*a* may be inserted into the corresponding grooves GV among the grooves GV positioned on the first side wall S1 or the fourth side wall S4. The first support lines CNT1*a* inserted into the corresponding grooves GV may be spaced apart from each other in a direction intersecting the fifth direction DR5 in a plan view. For example, the first support lines CNT1*a* may be arranged in the fourth direction DR4.

Another first support lines CNT1*b* may be inserted into the corresponding grooves GV among the grooves GV positioned on the second side wall S2 or the third side wall S3. The first support lines CNT1*b* inserted into the corresponding grooves GV may be spaced apart from each other in the direction intersecting the fifth direction DR5 in a plan view. For example, the first support lines CNT1*b* may be arranged in the fourth direction DR4.

In the area corresponding to the frame opening FR-O, the first support lines CNT1*a* and CNT1*b* and the second support lines CNT2*a* and CNT2*b* may intersect and overlap each other in a plan view. For example, in the area corresponding to the frame opening FR-O, each of the first support lines CNT1*a* and CNT1*b* may extend in the fifth direction DR5, and each of the second support lines CNT2*a* and CNT2*b* may extend in the fourth direction DR4 intersecting the fifth direction DR5. In the area corresponding to the frame opening FR-O, the first support lines CNT1*a* and CNT1*b* may be spaced apart from each other in the fourth direction DR4, and the second support lines CNT2*a* and CNT2*b* may be spaced apart from each other in the fifth direction DR5.

In the area corresponding to the frame opening FR-O, the first support lines CNT1*a* and CNT1*b* may be arranged above the second support lines CNT2*a* and CNT2*b*. However, the disclosure is not limited thereto, and in the area corresponding to the frame opening FR-O, the second support lines CNT2*a* and CNT2*b* may be arranged above the first support lines CNT1*a* and CNT1*b*.

The first support lines CNT1*a* and CNT1*b* and the second support lines CNT2*a* and CNT2*b* intersecting and overlapping each other in a plan view may constitute the mask MK forming the deposition openings MK-O. Each of the deposition openings MK-O may be surrounded and defined by adjacent first support lines CNT1*a* and CNT1*b* in the fourth direction DR4 and adjacent second support lines CNT2*a* and CNT2*b* in the fifth direction DR5 and intersecting the corresponding first support lines CNT1*a* and CNT1*b* in a plan view. The deposition openings MK-O defined by the first and second support lines CNT1*a*, CNT1*b*, CNT2*a*, and CNT2*b* may overlap the frame opening FR-O in a plan view.

The directions the first support lines CNT1*a* and CNT1*b* and the second support lines CNT2*a* and CNT2*b* extend and the positions of the grooves GV into which the first support lines CNT1*a* and CNT1*b* and the second support lines CNT2*a* and CNT2*b* are inserted may change according to a shape or area of the deposition openings MK-O.

In a method of manufacturing a mask assembly MA according to an embodiment of the disclosure, the mask assembly MA may be manufactured by coupling support lines CNT1 and CNT2 or CNT1, CNT2*a*, and CNT2*b* or CNT1*a*, CNT1*b*, CNT2*a*, and CNT2*b* including carbon nanotube fibers to a frame FR, and the mask assembly MA including a mask MK having improved durability. The mask MK formed by the support lines CNT1 and CNT2 or CNT1, CNT2*a*, and CNT2*b* or CNT1*a*, CNT1*b*, CNT2*a*, and CNT2*b* may be prevented from being damaged due to impact caused by contact with a manufacturing substrate M-SUB during a deposition process or impact by a cleaning solution during a cleaning process. Since the damage to the mask MK is prevented, a yield rate of the deposition process using the mask MK may be improved, and cost required to newly manufacture or restore the mask MK may be reduced.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A mask assembly comprising:
- a frame including a frame opening and grooves, each arranged in a first direction and a second direction intersecting the first direction; and
- a mask including support lines each inserted into a corresponding one of the grooves,
- wherein each of the support lines includes a carbon nanotube fiber.

2. The mask assembly of claim 1, wherein
the frame further includes:
- a first side wall, a second side wall, a third side wall, and a fourth side wall connected to each other and defining the frame opening; and
- protrusions arranged on the first, second, third, and fourth side walls and spaced apart from each other, the first side wall and the second side wall extend in the second direction and face each other in the first direction with the frame opening interposed between the first side wall and the second side wall,
the third side wall and the fourth side wall extend in the first direction and face each other in the second direction with the frame opening interposed between the third side wall and the fourth side wall, and
each of the grooves corresponds to a space between adjacent ones of the protrusions.

3. The mask assembly of claim 2, wherein the protrusions have a quadrangular shape, a trapezoidal shape, or an inverted trapezoidal shape in a cross-sectional view.

4. The mask assembly of claim 2, wherein a thickness of each of the protrusions in a thickness direction of the frame is less than or equal to a diameter of each of the support lines.

5. The mask assembly of claim 2, wherein
each of the support lines includes a first end and a second end,
the first end is disposed on an outer surface of one of the first, second, third, and fourth side walls, and
the second end is disposed on an outer surface of another one of the first, second, third, and fourth side walls.

6. The mask assembly of claim 2, wherein
the support lines comprise:
- first support lines extending in a direction; and
- second support lines extending in another direction, and the first support lines and the second support lines intersect each other in a plan view and define deposition openings overlapping the frame opening in a plan view.

7. The mask assembly of claim 6, wherein
each of the first support lines extends in the first direction,
the first support lines are arranged in the second direction,
each of the second support lines extends in the second direction,
the second support lines are arranged in the first direction.

8. The mask assembly of claim 6, wherein
each of the first support lines extends in the first direction,
the first support lines are arranged in the second direction,
each of the second support lines extends in a third direction,
the second support lines are arranged in a direction intersecting the third direction, and
the third direction intersects the first direction and the second direction.

9. The mask assembly of claim 6, wherein
each of the first support lines extends in a third direction,
the first support lines are arranged in a direction intersecting the third direction,
each of the second support lines extends in a fourth direction,
the second support lines are arranged in a direction intersecting the fourth direction, and the third direction and the fourth direction intersect the first direction and the second direction.

10. The mask assembly of claim 1, wherein each of the support lines is bent to a thickness direction of the frame and coupled to an outer surface of the frame, and the support lines comprise at least two support lines tilted in different directions and coupled to the outer surface of the frame.

11. The mask assembly of claim 1, wherein a width of each of the grooves in the first direction or the second direction is greater than or equal to a diameter of each of the support lines.

12. The mask assembly of claim 11, wherein the width of each of the grooves is constant along a thickness direction of the frame.

13. The mask assembly of claim 11, wherein the width of each of the grooves changes along a thickness direction of the frame.

14. A method of manufacturing a mask assembly, the method comprising:

providing a frame including a frame opening and grooves, each arranged in a first direction and a second direction intersecting the first direction;

coupling a first support line to the frame by inserting the first support line into a corresponding one of the grooves; and coupling a second support line to the frame by inserting the second support line into another corresponding one of the grooves, wherein each of the first support line and the second support line includes a carbon nanotube fiber, and an extension direction of the second support line intersects an extension direction of the first support line.

15. The method of claim 14, wherein the coupling of the first support line to the frame includes:

tensioning the first support line in a direction after fixing both ends of the first support line to grippers;

inserting the first support line into the corresponding one of the grooves after aligning the first support line on the corresponding one of the grooves; and coupling the first support line to an outer surface of the frame after positioning the both ends of the first support line on the outer surface of the frame.

16. The method of claim 15, wherein the coupling of the first support line to the outer surface of the frame includes welding a coupling member after providing the coupling member on a portion of the first support line disposed on the outer surface of the frame.

17. The method of claim 15, wherein the direction the first support line is tensioned is parallel to the first direction.

18. The method of claim 15, wherein the direction the first support line is tensioned intersects the first direction and the second direction.

19. The method of claim 15, wherein the coupling of the second support line to the frame includes:

tensioning the second support line in another direction after fixing both ends of the second support line to the grippers;

inserting the second support line into the another corresponding one of the grooves after aligning the second support line on the another corresponding one of the grooves; and coupling the second support line to the outer surface of the frame after positioning the both ends of the second support line on the outer surface of the frame.

20. The method of claim 19, wherein the another direction the second support line is tensioned is parallel to the second direction.

* * * * *